US009911733B2

(12) United States Patent
Yoshida et al.

(10) Patent No.: US 9,911,733 B2
(45) Date of Patent: Mar. 6, 2018

(54) SEMICONDUCTOR DEVICE AND METHOD OF MANUFACTURING SEMICONDUCTOR DEVICE

(71) Applicant: Fuji Electric Co., Ltd., Kawasaki-shi, Kanagawa (JP)

(72) Inventors: Souichi Yoshida, Matsumoto (JP); Hiroshi Miyata, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/337,405

(22) Filed: Oct. 28, 2016

(65) Prior Publication Data

US 2017/0047322 A1 Feb. 16, 2017

Related U.S. Application Data

(63) Continuation of application No. PCT/JP2015/081797, filed on Nov. 11, 2015.

(30) Foreign Application Priority Data

Nov. 17, 2014 (JP) .................................. 2014-232895

(51) Int. Cl.
*H01L 29/66* (2006.01)
*H01L 27/06* (2006.01)
(Continued)

(52) U.S. Cl.
CPC .......... *H01L 27/0664* (2013.01); *H01L 21/28* (2013.01); *H01L 27/04* (2013.01);
(Continued)

(58) Field of Classification Search
CPC ............ H01L 27/0635; H01L 29/0634; H01L 29/4236; H01L 29/7397; H01L 29/7827;
(Continued)

(56) References Cited

U.S. PATENT DOCUMENTS

2007/0048982 A1 3/2007 Nemoto et al.
2009/0283798 A1 11/2009 Tsuzuki et al.
2012/0043581 A1\* 2/2012 Koyama ............. H01L 29/0696
257/140

(Continued)

FOREIGN PATENT DOCUMENTS

JP H11-68124 A 3/1999
JP 2000-340750 A 12/2000
(Continued)

*Primary Examiner* — Vu A Vu
(74) *Attorney, Agent, or Firm* — Rabin & Berdo, P.C.

(57) ABSTRACT

A semiconductor device, including a semiconductor substrate, a plurality of trenches formed on a front surface of the semiconductor substrate, a plurality of gate electrodes formed in the trenches, a base region and an anode region formed between adjacent trenches respectively in first and second element regions of the semiconductor substrate, a plurality of emitter regions and contact regions selectively formed in the base region, an interlayer insulating film covering the gate electrodes, first and second contact holes penetrating the interlayer insulating film, a plurality of contact plugs embedded in the first contact holes, a first electrode contacting the contact plugs and contacting the anode region via the second contact hole, a collector region and a cathode region formed on a back surface of the semiconductor substrate respectively in the first and second element regions, and a second electrode contacting the collector region and the cathode region.

12 Claims, 17 Drawing Sheets

(51) Int. Cl.
  *H01L 21/28* (2006.01)
  *H01L 29/739* (2006.01)
  *H01L 29/78* (2006.01)
  *H01L 27/04* (2006.01)
  *H01L 29/861* (2006.01)
  *H01L 29/868* (2006.01)

(52) U.S. Cl.
  CPC .... *H01L 29/6609* (2013.01); *H01L 29/66333* (2013.01); *H01L 29/739* (2013.01); *H01L 29/7395* (2013.01); *H01L 29/78* (2013.01); *H01L 29/861* (2013.01); *H01L 29/868* (2013.01)

(58) Field of Classification Search
  CPC ..... H01L 21/8234; H01L 29/78; H01L 27/04; H01L 27/06; H01L 27/088; H01L 21/822; H01L 29/06; H02H 3/08; H03K 17/08
  USPC .......................................................... 257/140
  See application file for complete search history.

(56) References Cited

U.S. PATENT DOCUMENTS

| | | | | |
|---|---|---|---|---|
| 2012/0319163 | A1* | 12/2012 | Tsuzuki | H01L 21/263 257/140 |
| 2013/0001736 | A1* | 1/2013 | Yamaji | H01L 21/82348 257/499 |
| 2014/0206162 | A1* | 7/2014 | Eguchi | H01L 29/66712 438/268 |
| 2015/0325519 | A1* | 11/2015 | Peek | H01L 23/53257 257/231 |

FOREIGN PATENT DOCUMENTS

| | | |
|---|---|---|
| JP | 2007-059801 A | 3/2007 |
| JP | 2009-027152 A | 2/2009 |
| JP | 2009-124049 A | 6/2009 |
| JP | 2012-043890 A | 3/2012 |
| JP | 2012-216577 A | 11/2012 |
| JP | 2013-021304 A | 1/2013 |
| JP | 2015-106695 A | 6/2015 |

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2015/081797 filed on Nov. 11, 2015, which claims priority from a Japanese Patent Application No. 2014-232895 filed on Nov. 17, 2014, the contents of which are incorporated herein by reference.

BACKGROUND OF THE INVENTION

1. Field of the Invention

The embodiments discussed herein relate to a semiconductor device and a method of manufacturing a semiconductor device.

2. Description of the Related Art

Improvement of the characteristics of power semiconductor devices with a breakdown voltage class of 600 V, 1200 V, and 1700 V such as insulated gate bipolar transistors (IGBTs), free wheeling diodes (FWDs), and the like is advancing. These power semiconductor devices are used in power converting equipment such as highly efficient and power-saving inverters and the like, and are indispensable for controlling motors. There is urgent market demand for power semiconductor devices for such applications to have lower loss (more power-saving), higher speed, higher efficiency, and less adverse impact on the environment.

In response to such demands, with respect to the IGBTs, a method of fabricating a low-cost semiconductor device whose electric loss is low such as a low on-voltage has been proposed. For example, to prevent breakage of the wafer during the wafer processing, the wafer processing is started using a thick semiconductor wafer, which is ordinarily employed. At a process step as late in the wafer processing as possible, the semiconductor wafer is ground from a back surface thereof on the side opposite that of a front surface on which a MOS gate (an insulated gate including a metal oxide semiconductor) structure is formed, whereby the thickness of the semiconductor wafer reduced as much as possible to the extent that desired properties are acquired. An impurity is ion-implanted at a desired impurity concentration from the back surface after the grinding of the wafer and is activated, and a collector layer is thereby formed on the back surface side of the wafer.

The development and the manufacture of semiconductor devices that use the method of realizing a low-loss property at a low cost by reducing the thickness of the semiconductor wafer as described above have recently become mainstream especially for power semiconductor devices. For IGBTs in particular, to further facilitate reduction of the loss, an indispensable process step involves forming a field stop (FS) layer at a position deeper than a collector layer from the back surface of the wafer on the collector side of the drift layer by ion-implanting an impurity from the back surface after the grinding of the semiconductor wafer. The field stop layer is a semiconductor layer whose impurity concentration is higher than that of the drift layer and whose conductivity type is same as that of the drift layer, and has a function of suppressing a depletion layer that extends from a pn-junction between a base region and the drift layer such that the depletion layer does not reach the collector layer during turn off.

To facilitate overall size reductions of a power converting device (a related chip including an IGBT), development is also advancing for a reverse conducting-IGBT (RC-IGBT) that has a structure formed by integrating an IGBT and an FWD connected in reverse-parallel to the IGBT with each other, by incorporating the IGBT and the FWD in one same semiconductor chip. A configuration of a conventional RC-IGBT will be described taking an example of a configuration formed by integrating an IGBT including a field stop layer (an FS-IGBT) and an FWD connected in reverse-parallel to the FS-IGBT with each other, by incorporating the FS-IGBT and the FWD in one same semiconductor chip. FIG. 17 is a cross-sectional view of the configuration of the conventional RC-IGBT having the field stop structure.

As depicted in FIG. 17, in the conventional RC-IGBT, a trench-gate MOS gate (an insulated gate including a metal oxide semiconductor) structure 120 is formed on the side of the front surface of an $n^-$-type semiconductor substrate to be an $n^-$-type drift layer 101 in an IGBT portion 121. The MOS gate structure 120 includes a p-type base region 102, a trench 103, a gate oxide film 104, a gate electrode 105, an $n^+$-type emitter region 106, and a $p^+$-type contact region 107. An emitter electrode 108 contacts the $n^+$-type emitter region 106 and the $p^+$-type contact region 107. The emitter electrode 108 generally includes Al (aluminum)-Si (silicon).

The p-type base region 102, the trench 103, the emitter electrode 108, and an interlayer insulating film 109 are formed from the IGBT portion 121 to the FWD portion 122. In the FWD portion 122, the p-type base region 102 and the emitter electrode 108 also respectively act as a p-type anode region and an anode electrode of the FWD. A favorable ohmic contact (electrical contact presenting an ohmic property (linearity)) with the p-type base region 102 may be realized in the IGBT portion 121 by using Ai-Si as the electrode material of the emitter electrode 108 as described above. Favorable ohmic contact with the p-type base region 102 (the p-type anode region) may be realized also in the FWD portion 122 by using Ai-Si as the electrode material of the emitter electrode 108.

An n-type field stop layer 110, a $p^+$-type collector region 111, and an $n^+$-type cathode region 112 are formed on the back surface side of the $n^-$ semiconductor substrate. The $p^+$-type collector region 111 is formed in the IGBT portion 121. The $n^+$-type cathode region 112 is formed in the FWD portion 122 side by side with (parallel to) the $p^+$-type collector region 111. The $p^+$-type collector region 111 and the $n^+$-type cathode region 112 are formed at positions shallower than the n-type field stop layer 110 from the back surface of the $n^-$-type semiconductor substrate. The collector electrode 113 also acts as the cathode electrode and contacts the $p^+$-type collector region 111 and the $n^+$-type cathode region 112.

A device has been proposed as the above RC-IGBT where, in addition to a first trench having a gate electrode embedded therein through the gate insulating film, a second trench reaching the inside of the p-type base region is formed and an emitter electrode is embedded in the second trench (see, e.g., Japanese Laid-Open Patent Publication No. 2009-027152 (Paragraph 0054, FIG. 1)). In Japanese Laid-Open Patent Publication No. 2009-027152, a barrier metal is formed along the inner wall of the second trench using titanium (Ti), tungsten (W), or the like. In Japanese Laid-Open Patent Publication No. 2009-027152, the emitter electrode is electrically connected to an $n^+$-type emitter region and a $p^+$-type contact region in an IGBT portion and the p-type base region (a p-type anode region) in the FWD portion, through the barrier metal.

A device has been proposed as another RC-IGBT where, the width of each contact hole in the FWD portion and an FWD operating portion in the IGBT portion is larger than the width of each contact hole in the IGBT operation unit (see, e.g., Japanese Laid-Open Patent Publication No. 2013-021304). In Japanese Laid-Open Patent Publication No. 2013-021304, the recovery property is improved by reducing the area density of the p-type impurity in the FWD operating portion in the IGBT portion and thereby suppressing injection of holes into the FWD portion. A device has been proposed as a conventional diode whose anode electrode is formed using an alloy formed by including silicon at 1% in aluminum (AlSi1%) (see, e.g., Japanese Laid-Open Patent Publication No. 2007-059801 (Paragraph 0036)).

SUMMARY OF THE INVENTION

According to one aspect of the present invention, a semiconductor device includes a semiconductor substrate forming a drift layer of a first conductivity type, and including a first element region in which an insulated gate bipolar transistor is formed and a second element region in which a diode is formed; plural trenches formed on a front surface of the semiconductor substrate, from the first element region to the second element region; a gate electrode formed in at least some trenches of the plural trenches, through a gate insulating film; a base region of a second conductivity type formed between adjacent trenches of the plural trenches in the first element region; an anode region of the second conductivity type formed between the adjacent trenches in the second element region; an emitter region of the first conductivity type selectively formed in the base region; a first contact region of the second conductivity type selectively formed in the base region and having an impurity concentration higher than that of the base region; an interlayer insulating film covering the gate electrode; a first contact hole penetrating the interlayer insulating film in a depth direction so as to expose therein the emitter region and the first contact region; a second contact hole penetrating the interlayer insulating film in the depth direction so as to expose therein the anode region; a contact plug embedded in the first contact hole so as to contact the emitter region and the first contact region; a first electrode contacting the contact plug and embedded in the second contact hole so as to contact the anode region; a collector region of the second conductivity type formed on a back surface of the semiconductor substrate in the first element region; a cathode region of the first conductivity type formed on the back surface of the semiconductor substrate in the second element region; and a second electrode contacting the collector region and the cathode region.

In the semiconductor device, the contact plug includes at least: a titanium layer contacting the emitter region and the first contact region; and a tungsten layer contacting the first electrode.

In the semiconductor device, the first electrode is formed of a metal comprising aluminum as a main component thereof.

In the semiconductor device, the second contact hole has a width along an arrangement direction in which the first element region and the second element region are arranged greater than a width of the first contact hole along the arrangement direction of the first element region and the second element region.

In the semiconductor device, an interval between the adjacent trenches of the second element region is greater than an interval between the adjacent trenches of the first element region.

In the semiconductor device, a second contact region of the second conductivity type is selectively formed in the anode region and having an impurity concentration higher than that of the anode region.

According to another aspect of the invention, a semiconductor device includes a semiconductor substrate forming a drift layer of a first conductivity type, and including a first element region in which an insulated gate bipolar transistor is formed and a second element region in which a diode is formed; plural trenches formed on a front surface of the semiconductor substrate, from the first element region to the second element region; a gate electrode formed in at least some trenches of the plural trenches, through a gate insulating film; a base region of a second conductivity type formed between adjacent trenches of the plural trenches; an emitter region of the first conductivity type selectively formed in the base region in the first element region; a contact region of the second conductivity type selectively formed in the base region and having an impurity concentration higher than that of the base region; an interlayer insulating film covering the gate electrode; a first contact hole penetrating the interlayer insulating film in a depth direction in the first element region, so as to expose therein the emitter region and the contact region; a second contact hole penetrating the interlayer insulating film in the depth direction in the second element region, so as to expose therein the base region and the contact region; a first contact plug embedded in the first contact hole so as to contact the emitter region and the contact region; a second contact plug embedded in the second contact hole so as to contact the base region and the contact region; a first electrode contacting the first contact plug and the second contact plug; a collector region of the second conductivity type formed on a back surface of the semiconductor substrate in the first element region; a cathode region of the first conductivity type formed on the back surface of the semiconductor substrate in the second element region; and a second electrode contacting the collector region and the cathode region. The second contact hole is further formed in an intermediate region of an interface between the first element region and the second element region. The contact region alone is formed in the base region exposed in the second contact hole in the intermediate region of the interface between the first element region and the second element region.

According to another aspect of the invention, a method of manufacturing a semiconductor device manufactures a semiconductor device including a semiconductor substrate forming a drift layer of a first conductivity type, and including a first element region in which an insulated gate bipolar transistor is formed and a second element region in which a diode is formed; further including as a front surface element structure of the insulated gate bipolar transistor, plural trenches formed on a front surface of the semiconductor substrate from the first element region to the second element region; a gate electrode formed in at least some trenches of the plural trenches through a gate insulating film; a base region of a second conductivity type formed between adjacent trenches of the plural trenches in the first element region; an emitter region of the first conductivity type selectively formed in the base region; and a first contact region of the second conductivity type selectively formed in the base region and having an impurity concentration higher than that of the base region; and further including as a front surface element structure of the diode, the plural trenches; the gate electrode; and an anode region of the second conductivity type formed between the adjacent trenches of the second element region. The method includes forming the front surface element structures of the insulated gate bipolar transistor and the diode on a front surface of the semiconductor substrate; forming an interlayer insulating film so as to cover the front surface element structures; forming a first contact hole to penetrate the interlayer insulating film so as to expose therein the emitter region and the first contact region, and a second contact hole to penetrate the interlayer insulating film in a depth direction so as to expose therein the anode region and to have a width in an arrangement direction along which the first element region and the second element region are arranged to greater than that of the first contact hole; depositing a metal layer on the front surface of the semiconductor substrate so as to be embedded in the first contact hole; etching back the metal layer to remove the metal layer on a surface of the interlayer insulating film and in the second contact hole so that the metal layer in the first contact hole remains as a contact plug of the emitter region and the first contact region; and forming a first electrode to contact the contact plug and to be embedded in the second contact hole.

According to another aspect of the invention, a method of manufacturing a semiconductor device manufactures a semiconductor device including a semiconductor substrate forming a drift layer of a first conductivity type, and including a first element region in which an insulated gate bipolar transistor is formed and a second element region in which a diode is formed; further including as a front surface element structure of the insulated gate bipolar transistor, plural trenches formed on a front surface of the semiconductor substrate from the first element region to the second element region; a gate electrode formed in at least some trenches of the plural trenches through a gate insulating film; a base region of a second conductivity type formed between adjacent trenches of the plural trenches; an emitter region of the first conductivity type selectively formed in the base region in the first element region; and a first contact region of the second conductivity type selectively formed in the base region in the first element region and having an impurity concentration higher than that of the base region; and further including as a front surface element structure of the diode; the plurality of trenches; the gate electrode; and the base region. The method includes forming the front surface element structures of the insulated gate bipolar transistor and the diode on a front surface of the semiconductor substrate; forming an interlayer insulating film so as to cover the front surface element structures; forming a first contact hole to penetrate the interlayer insulating film in a depth direction in the first element region so as to expose therein the emitter region and the first contact region, and a second contact hole to penetrate the interlayer insulating film in the depth direction in the second element region so as to expose therein the base region; selectively forming a second contact region of the second conductivity type and having an impurity concentration higher than that of the base region, in the base region exposed in the second contact hole; depositing a metal layer on the front surface of the semiconductor substrate so as to be embedded in the first contact hole and the second contact hole; etching back the metal layer to remove the metal layer on a surface of the interlayer insulating film so that the metal layer in the first contact hole remains as a first contact plug of the emitter region and the first contact region, and so that the metal layer in the second contact hole remains as a second contact plug of the base region and the second contact region; and forming a first electrode to contact the first contact plug and the second contact plug. The second contact hole is also formed in an intermediate region of an interface between the first element region and the second element region.

In the method, the first contact hole and the second contact hole are formed to have equal widths in an arrangement direction along which the first element region and the second element region are arranged.

In the method, the second contact region is formed by ion-implanting boron fluoride.

In the method, at least a titanium layer and a tungsten layer are sequentially deposited as the metal layer.

In the method, the first electrode is formed comprising aluminum as a main component.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
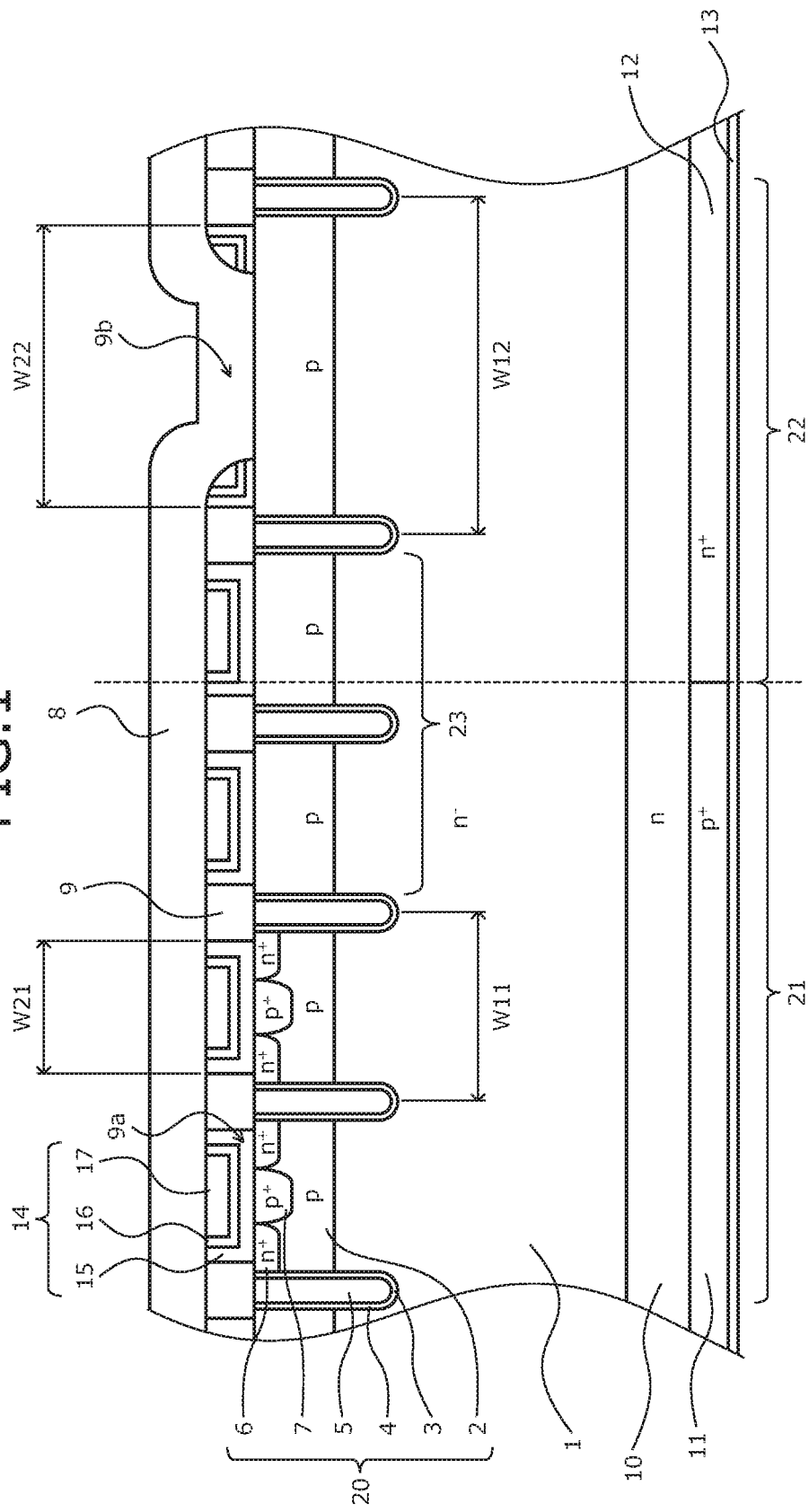
FIG. 1 is a cross-sectional view of a structure of a semiconductor device according to a first embodiment.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, identical constituent elements will be given the same reference numerals and will not be repeatedly described.

A structure of the semiconductor device according to the first embodiment will be described. FIG. 1 is a cross-sectional view of the structure of the semiconductor device according to the first embodiment. As depicted in FIG. 1, the semiconductor device according to the first embodiment includes an IGBT portion having an IGBT formed therein (a first element region) 21 and an FWD portion having an FWD formed therein (a second element region) 22, on a single n⁻-type semiconductor substrate (a semiconductor chip) forming an n⁻-type drift layer 1. The description will be made taking an example of a case where an FS-IGBT including an n-type field stop layer 10 is formed as the IGBT of the IGBT portion 21. The FWD of the FWD portion 22 is connected in reverse-parallel to the FS-IGBT in the IGBT portion 21. The semiconductor device according to the first embodiment is an RC-IGBT that is formed by integrating the FS-IGBT and the FWD with each other by incorporating the FS-IGBT and the FWD on a single semiconductor chip.

For example, in the IGBT portion 21, a p-type base region 2 is formed in a surface layer of the front surface of the n⁻-type semiconductor substrate. A trench 3 is formed that penetrates the p-type base region 2 from the front surface of the n⁻-type semiconductor substrate in the depth direction to reach the n⁻-type drift layer 1. The trench 3 is formed in a planar layout, for example, of stripes extending along a direction (the direction of the depth of the page surface of FIG. 1 and, hereinafter, referred to as "second direction") orthogonal to a direction (the right-and-left direction on the page surface of FIG. 1, hereinafter, referred to as "first direction") along which the IGBT portion 21 and the FWD portion 22 are arranged. The p-type base region 2 is separated into plural regions (mesa portion) by the trenches 3. A gate electrode 5 is formed in the trench 3 through a gate insulating film 4.

An n⁺-type emitter region 6 is selectively formed in the mesa portion sandwiched by adjacent trenches 3, of the p-type base region 2. The n⁺-type emitter region 6 is formed at a position facing the gate electrode 5 sandwiching therebetween the gate insulating film 4 of the side wall of the trench 3. A p⁺-type contact region 7 is selectively formed in the mesa portion sandwiched by the trenches 3 adjacent to each other. The p⁺-type contact region 7 is formed on a central portion side of the mesa portion to be closer thereto than the n⁺-type emitter region 6, and contacts the n⁺-type emitter region 6. The p-type base region 2, the trench 3, the gate insulating film 4, the gate electrode 5, the n⁺-type emitter region 6 and the p⁺-type contact region 7 constitute a trench gate MOS gate structure 20. An interlayer insulating film 9 is formed on the front surface of the n⁻-type semiconductor substrate to cover the gate electrode 5.

A first contact hole 9a is formed that penetrates the interlayer insulating film 9 in the depth direction to expose therein the n⁺-type emitter region 6 and the p⁺-type contact region 7. A contact plug (a part to take out the electrode) 14 is embedded in the first contact hole 9a. The contact plug 14 is formed by sequentially stacking a titanium (Ti) layer 15, a titanium nitride (TiN) layer 16, and a tungsten (W) layer 17 from the front surface side of the n⁻-type semiconductor substrate.

The titanium layer 15 is formed along the front surface of the n⁻-type semiconductor substrate (the surfaces of the n⁺-type emitter region 6 and the p⁺-type contact region 7) from the side wall of the first contact hole 9a. The titanium layer 15 functions as a barrier metal layer between the semiconductor portion (a silicon unit) and the tungsten layer 17 between which the contact (the electrical contact) is not favorable. The titanium layer 15 contacts the n⁺-type emitter region 6 and the p⁺-type contact region 7 and realizes favorable ohmic contact (the electrical contact presenting an ohmic property (the linearity)) with the p⁺-type contact region 7.

A titanium nitride film 16 is formed on the titanium layer 15 in the first contact hole 9a. The tungsten layer 17 is formed on the titanium nitride layer 16. An emitter electrode (a first electrode) 8 is formed on the interlayer insulating film 9 and the contact plug 14.

The emitter electrode 8 contacts, for example, all of the titanium layer 15, the titanium nitride layer 16, and the tungsten layer 17. The emitter electrode 8 is electrically connected to the n⁺-type emitter region 6 and the p⁺-type contact region 7 through the contact plug 14 embedded in the first contact hole 9a. The contact plug 14 functions as an emitter electrode. The emitter electrode 8 includes, for example, Al (aluminum)-Si (silicon). The design rule of the IGBT portion 21 is for size reduction. For example, the IGBT portion 21 is configured using the smallest dimensions (the finest pattern dimensions) of the design rule (the design standard).

On the other hand, the FWD portion 22 is configured using a design rule that is larger than that of the IGBT portion 21. For example, the p-type base region 2, the trench 3 (including the gate insulating film 4 and the gate electrode 5 in the trench 3), the emitter electrode 8, and the interlayer insulating film 9 are formed from the IGBT portion 21 to the FWD portion 22.

In the FWD portion 22, the p-type base region 2 and the emitter electrode 8 respectively act also as a p-type anode region and an anode electrode of the FWD. The p-type base region 2 functioning as the p-type anode region is exposed in a second contact hole 9b that penetrates the interlayer insulating film 9 in the depth direction.

A pitch W12 of the trenches 3 (an interval between adjacent trenches 3) of the FWD portion 22 is larger than a pitch W11 of the trenches 3 of the IGBT portion 21 (W11<W12). A width W22 of the second contact hole 9b (the width in the first direction) is larger than a width W21 of the first contact hole 9a (W21<W22).

The second contact hole 9b has the emitter electrode 8 embedded therein and the emitter electrode 8 contacts the p-type base region 2 in the second contact hole 9b. The FWD portion 22 does not have the contact plug 14 formed therein. The titanium layer 15 is not in contact with the p-type base region 2 (the p-type anode region) of the FWD portion 22 and degradation of the contact with the p-type base region 2 may be prevented thereby. The p-type base region 2 of the FWD portion 22 contacts the emitter electrode 8 for which the electrode material is Ai-Si as above. Thus, favorable ohmic contact between the emitter electrode 8 and the p-type base region 2 may be further obtained in the FWD portion 22.

An intermediate region 23 is formed in the interface between the IGBT portion 21 and the FWD portion 22 on the front surface side of the n⁻-type semiconductor substrate. The width of the contact hole being the width W21 that is equal to that of the first contact hole 9a, is common to the intermediate region 23 and the IGBT portion 21. Similar to the IGBT portion 21, the intermediate region 23 includes the first contact hole 9a. On the other hand, different from the IGBT portion 21, the intermediate region 23 does not have the n⁺-type emitter region 6 formed therein. Different from the FWD portion 22, the first contact hole 9a of the intermediate region 23 has the contact plug 14 formed therein. In the intermediate region 23, conductivity modulation of the FWD portion 22 tends to be avoided corresponding to the extent by which the contact resistance of the intermediate region 23 is higher than that of the FWD portion 22, and the anode injection efficiency is lower than that of the FWD portion 22. The intermediate region 23 may thereby reduce the carrier concentration to be lower than that of the FWD portion 22 and may reduce interference with the operation of the IGBT portion 21 when the FWD portion 22 operates.

In the surface layer of the back surface of the $n^-$-type semiconductor substrate, the n-type field stop layer 10 is formed from the IGBT portion 21 to the FWD portion 22. The n-type field stop layer 10 has a function of suppressing the depletion layer extending from a pn-junction between the p-type base region 2 and the $n^-$-type drift layer 1 during turnoff such that the depletion layer does not reach the $p^+$-type collector region 11.

In the surface layer of the back surface of the $n^-$-type semiconductor substrate, the $p^+$-type collector region 11 and the $n^+$-type cathode region 12 are formed at positions shallower than the n-type field stop layer 10 from the back surface of the $n^-$-type semiconductor substrate. The portion of the $n^-$-type semiconductor substrate other than the p-type base region 2, the n-type field stop layer 10, the $n^+$-type collector region 11, and the $n^+$-type cathode region 12, is the $n^-$-type drift layer 1.

The $p^+$-type collector region 11 is formed in the IGBT portion 21. The $n^+$-type cathode region 12 is formed in the FWD portion 22. The $n^+$-type cathode region 12 is formed side by side with (parallel to) the $p^+$-type collector region 11 along a direction horizontal to the back surface of the $n^-$-type semiconductor substrate. The $p^+$-type collector region 11 and the $n^+$-type cathode region 12 are formed at positions shallower than the n-type field stop layer 10 from the back surface of the $n^-$-type semiconductor substrate. A collector electrode (a second electrode) 13 also acts as the cathode electrode and contacts the $p^+$-type collector region 11 and the $n^+$-type cathode region 12.

Not especially limited hereto, the dimensions of the components of the RC-IGBT according to the first embodiment may take, for example, the following values. In the IGBT portion 21, the pitch W11 of the trenches 3 may be set to be, for example, about 2.3 µm, and the width (the width in the first direction) W21 of the first contact hole 9a may be set to be, for example, about 0.5 µm. In the FWD portion 22, the pitch W12 of the trenches 3 may be set to be, for example, larger than 2.3 µm and, preferably, may be set to be wide to the extent the breakdown voltage does not become lower than the predetermined breakdown voltage, to be, for example, about 4.6 µm. The width W22 of the second contact hole 9b is set to be wide such that the contact plug 14 does not fully fill the second contact hole 9b when the contact plug 14 is fully embedded in the first contact hole 9a as described later. For example, the width W22 of the second contact hole 9b may be set to be, for example, about 1.0 µm.

Figure 2:
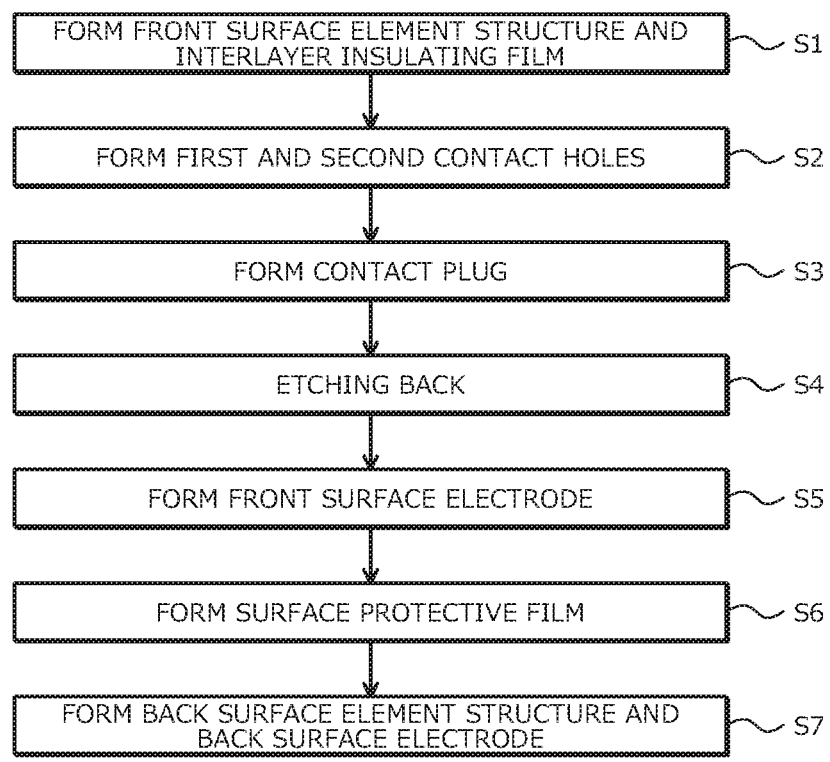
FIG. 2 is a flowchart of an overview of a method of manufacturing a semiconductor device according to the first embodiment.

The method of manufacturing a semiconductor device according to the first embodiment will be described. FIG. 2 is a flowchart of an overview of the method of manufacturing a semiconductor device according to the first embodiment. FIGS. 3, 4, 5, and 6 are cross-sectional views of states in the course of the manufacture of the semiconductor device according to the first embodiment.

According to an ordinary method, the front surface element structure is formed on the side of the front surface of the $n^-$-type semiconductor substrate (the semiconductor wafer) forming the $n^-$-type drift layer 1, and the interlayer insulating film 9 is formed to cover the front surface of the $n^-$-type semiconductor substrate (step S1). The front surface element structure includes the trench gate MOS gate structure 20 of the IGBT portion 21, and the p-type base region 2, the trench 3, the gate insulating film 4, and the gate electrode 5 of the FWD portion 22. The pitch W12 of the trench 3 of the FWD portion 22 is set to be wider than the pitch W11 of the trench 3 of the IGBT portion 21 as described above (W11<W12).

Figure 3:
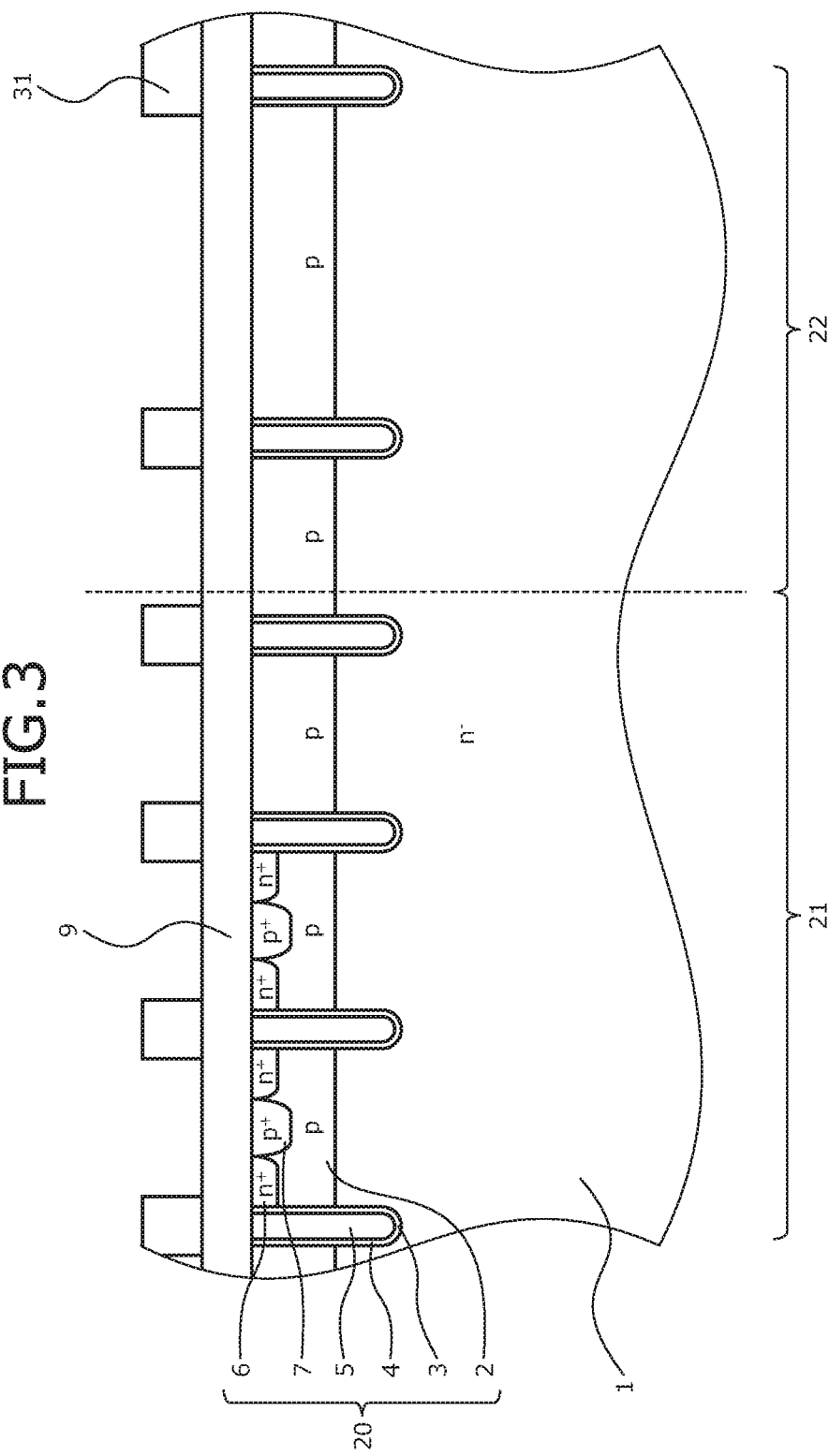
FIGS. 3, 4, 5, and 6 are cross-sectional views of states in the course of manufacture of the semiconductor device according to the first embodiment.

A resist mask 31 including openings in the formation regions for the first and the second contact holes 9a and 9b is formed on the interlayer insulating film 9 using photolithography. FIG. 3 depicts the state of the manufacture completed so far.

Figure 4:
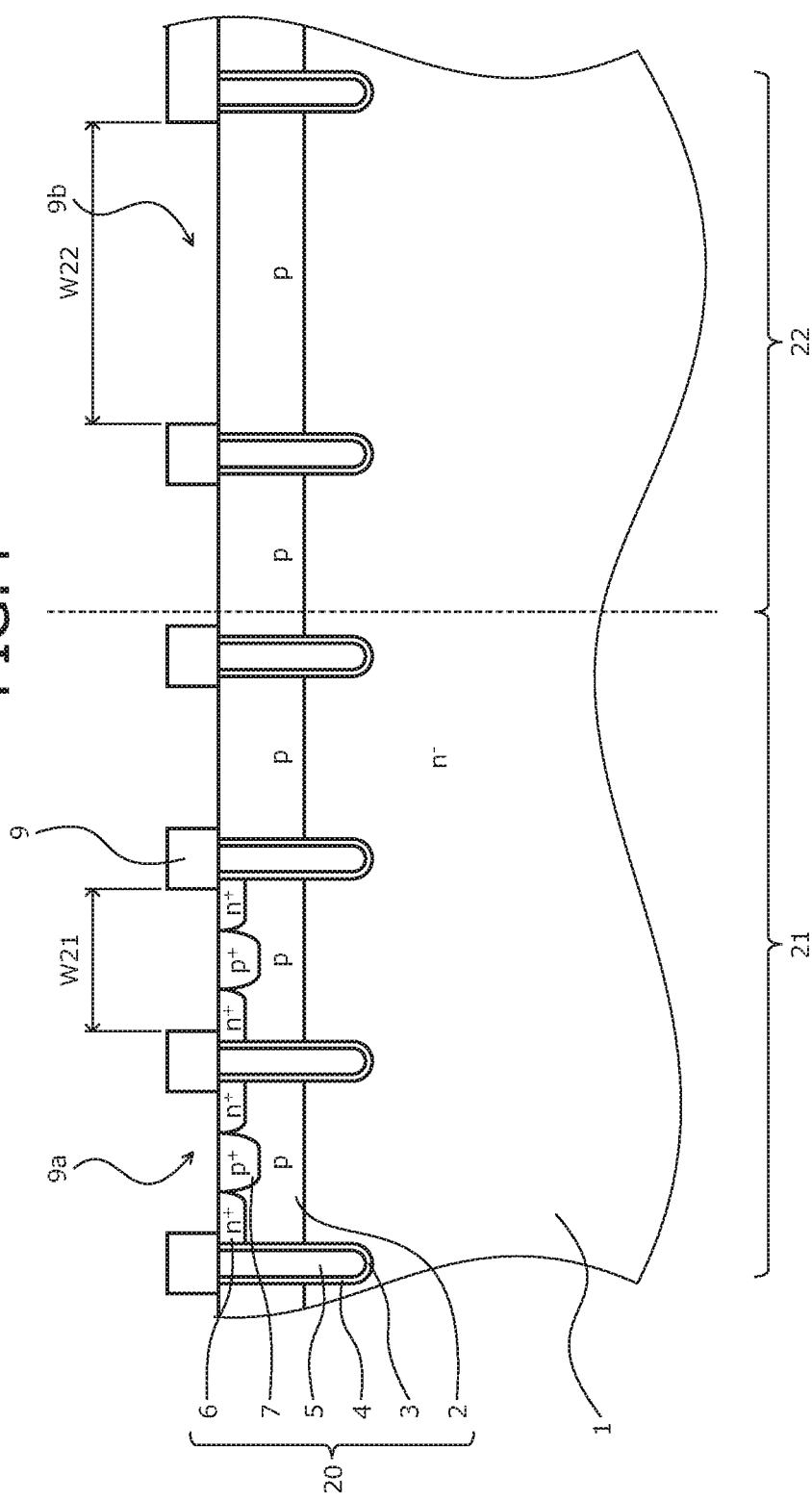

The interlayer insulating film 9 is etched using the resist mask 31 as a mask to form the first and the second contact holes 9a and 9b (step S2). At this time, as described above, the width W22 of the second contact hole 9b is set to be wider than the width W21 of the first contact hole 9a (W21<W22). The $n^+$-type emitter region 6 and the $p^+$-type contact region 7 are exposed in the first contact hole 9a, and the p-type base region 2 of the FWD portion 22 is exposed in the second contact hole 9b. The resist mask is removed. FIG. 4 depicts the state of the manufacture completed so far.

The titanium layer 15 and the titanium nitride layer 16 are sequentially deposited (formed) using physical vapor deposition (PVD) such as, for example, sputtering. The tungsten layer 17 is further deposited using, for example, chemical vapor deposition (CVD) and the contact plug 14 is thereby formed that includes the titanium layer 15, the titanium nitride layer 16, and the tungsten layer 17 (step S3).

At step S3, the titanium layer 15, the titanium nitride layer 16, and the tungsten layer 17 are sequentially deposited such that the contact plug 14 is fully embedded in the first contact hole 9a. The surface of the contact plug 14 of the portion thereof embedded in the first contact hole 9a has a height that is substantially equal to that of the surface of the contact plug 14 on the interlayer insulating film 9. The surface of the contact plug 14 in the IGBT portion 21 is substantially flat.

Figure 5:
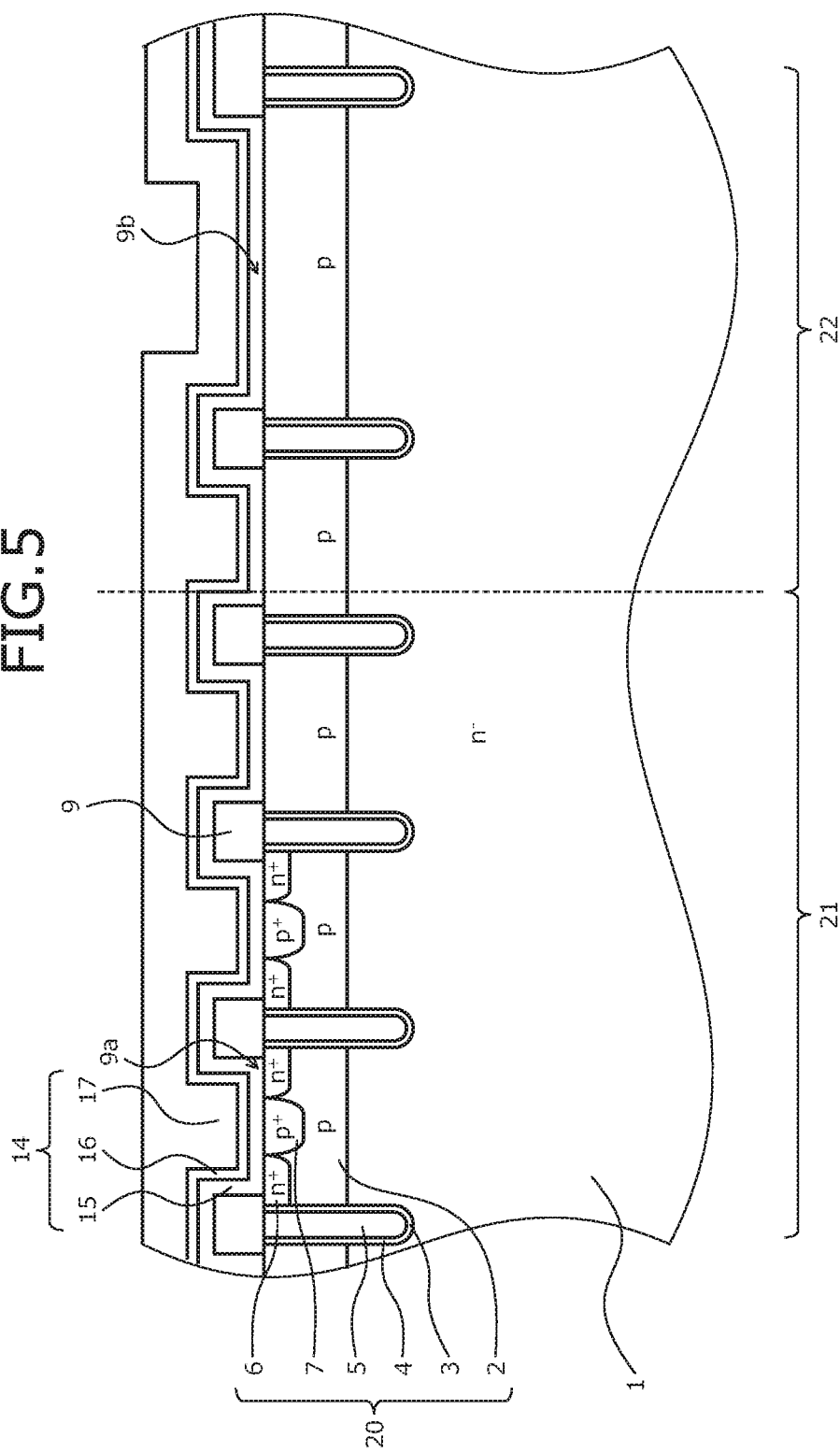

On the other hand, because the width W22 of the second contact hole 9b is greater than the width W21 of the first contact hole 9a as described above, the contact plug 14 is not fully embedded in the second contact hole 9b. In the FWD portion 22, the surface of the contact plug 14 has a recess in the portion thereof corresponding to the second contact hole 9b. FIG. 5 depicts the state of the manufacture completed so far.

The entire semiconductor wafer is heated by annealing (heat treatment). The electrical adhesion between the contact plug 14 and the semiconductor portion is thereby improved and the ohmic contact between the titanium layer 15 and the $p^+$-type contact region 7 is formed. The contact plug 14 is etched back until the interlayer insulating film 9 is exposed (step S4). At step S4, the contact plug 14 remains fully filling the first contact hole 9a.

On the other hand, the contact plug 14 is not fully embedded in the contact hole 9b as described above. To avoid embedding of the contact plug 14 in the second contact hole 9b in the FWD portion 22, the width W22 of the second contact hole 9b is set to be greater than the thickness of the interlayer insulating film 9.

The tungsten layer 17 may be embedded in the contact hole by setting the width of the contact hole to be substantially equal to the thickness of the interlayer insulating film 9 or to be equal to or less than the thickness of the interlayer insulating film 9. The tungsten layer 17 is therefore not fully embedded when the width W22 of the second contact hole 9b is set to be larger than the thickness of the interlayer insulating film 9. The deposition thickness of the tungsten layer 17 is advantageously set to be less than the width W22 of the second contact hole 9b. The surface of the n⁻-type semiconductor substrate is thereby exposed in the second contact hole 9b when the tungsten layer 17 and the barrier metal (the titanium nitride layer 16 and the titanium layer 15) are etched back.

Figure 6:
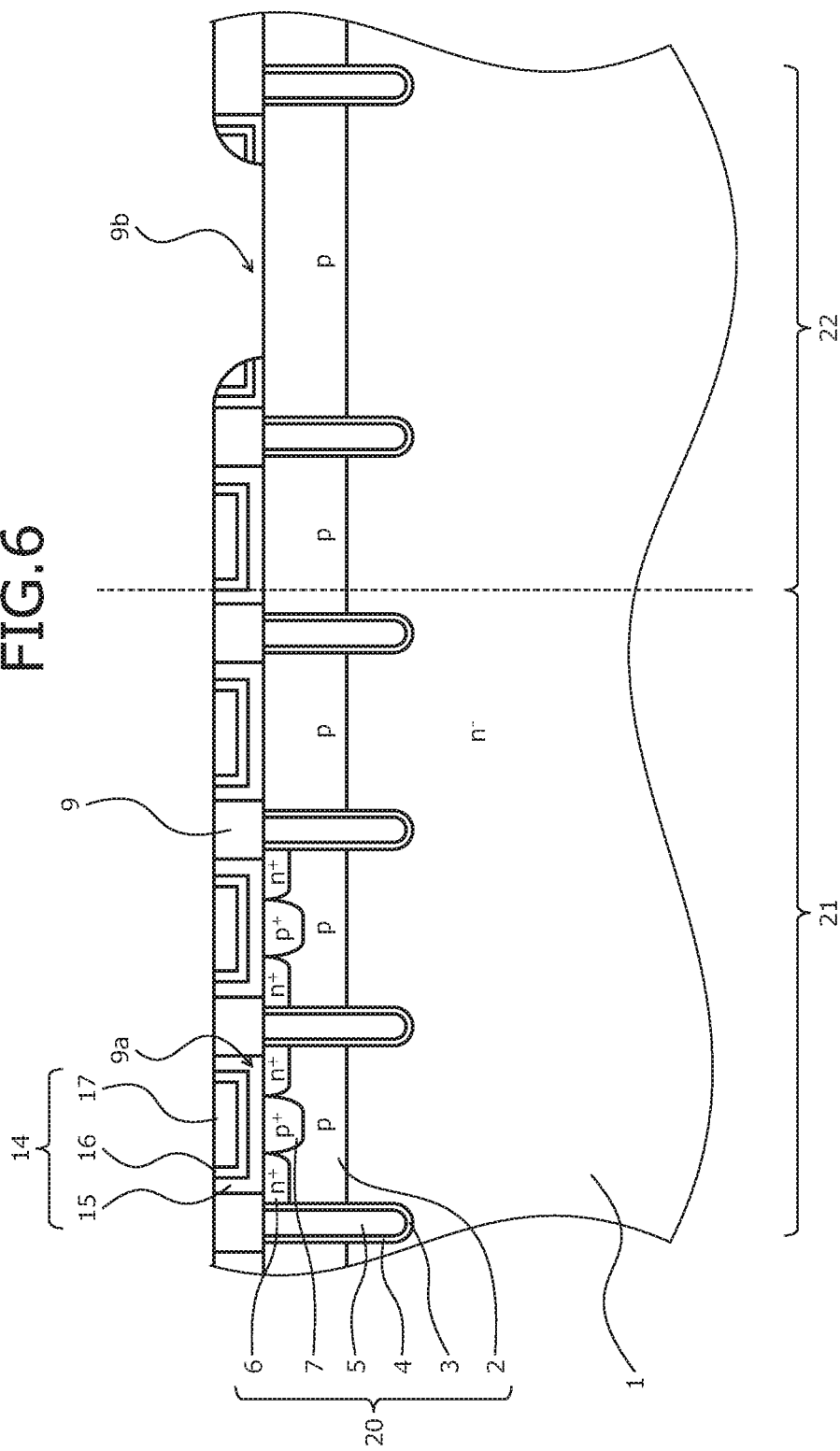

On the other hand, in the IGBT portion 21, the contact plug 14 is formed from the side wall of the first contact hole 9a along the front surface of the n⁻-type semiconductor substrate and the thickness of the contact plug 14 is substantially equal to the thickness of the contact plug 14 on the interlayer insulating film 9. Based on the above, the contact plug 14 in the second contact hole 9b is removed together with the contact plug 14 on the interlayer insulating film 9, and the semiconductor portion (the surface of the p-type base region 2 functioning as the p-type anode region) is exposed in the second contact hole 9b. FIG. 6 depicts the state of the manufacture completed so far.

Residues of the tungsten layer 17 and the barrier metal may remain on the side wall of the second contact hole 9b of the FWD portion 22 as depicted in FIG. 6 depending on the conditions for the etching back of the tungsten layer 17 and the barrier metal. The residues may be left as they are when the residues remain to the extent that the contact resistance of the FWD portion 22 is not affected.

The emitter electrode 8 including, for example aluminum as a main constituent is formed as a front surface electrode to have a thickness of, for example, 5 μm on the interlayer insulating film 9 and the contact plug 14, to be embedded in the second contact hole 9b using, for example, sputtering (step S5). At this step, the emitter electrode 8 and the p-type base region 2 are brought into contact with each other in the second contact hole 9b because the p-type base region 2 is exposed in the second contact hole 9b. The entire semiconductor wafer is heat treated by annealing. The electric adhesion is thereby improved between the emitter electrode 8 and the semiconductor portion, and ohmic contact is formed between the emitter electrode 8 and the p-type base region 2.

A surface protective film not depicted and including, for example, polyimide, is formed to protect the front surface side of the n⁻-type semiconductor substrate (step S6). The surface protective film covers, for example, an edge terminating structure portion surrounding the periphery of the active region that has the IGBT portion 21 and the FWD portion 22 formed therein. The active region is the region through which current flows during an on-state. The edge terminating structure portion is the region that mitigates the electric field on the front surface side of the n⁻-type drift layer 1 to sustain the breakdown voltage. The emitter electrode 8 is exposed in the active region to function as an electrode pad.

According to the ordinary method, a back surface element structure is formed on the back surface side of the n⁻-type semiconductor substrate and the collector electrode 13 is formed as the back surface electrode (step S7). The back surface element structure includes the n-type field stop layer 10, the p⁺-type collector region 11, and the n⁺-type cathode region 12. Thereafter, the semiconductor wafer is cut into individual chips (diced). The RC-IGBT depicted in FIG. 1 is thereby completed.

As described above, according to the first embodiment, ohmic contact may be realized in each of the IGBT portion and the FWD portion even when the IGBT portion is subject to size reductions, by optimizing the electrode material constituting the contact in each of the IGBT portion and the FWD portion for the diffusion region (the semiconductor portion).

According to the first embodiment, the contact plug does not fully fill the second contact hole when the contact plug is embedded in the first contact hole, by setting the width of the contact hole of the FWD portion (the second contact hole) to be greater than the width of the contact hole of the IGBT portion (the first contact hole). Thus, the semiconductor portion (the p-type base region functioning as the anode region) may be exposed in the second contact hole in a state where the contact plug is embedded in the first contact hole, by etching back the contact plug. By depositing the emitter electrode in this state, the emitter electrode and the semiconductor portion become electrically connected to each other through the contact plug in the IGBT portion and the emitter electrode and the semiconductor portion become directly connected to each other in the FWD portion. The contacts of the IGBT portion and the FWD portion may be formed using electrode materials different from each other, and ohmic contact may be realized in each of the IGBT portion and the FWD portion.

For example, in the IGBT portion, the emitter electrode includes a layered structure that includes the contact plug formed by sequentially stacking the titanium layer, the titanium nitride layer, and the tungsten layer, and the metal film including aluminum as the main constituent. In the FWD portion, the anode electrode includes a single layer structure that includes the metal layer including aluminum as the main constituent. In size reduction for the IGBT portion, even when the contact of the IGBT portion is formed using titanium, no titanium layer degrading the contact with the p-type base region is formed in the FWD portion after the completion of the product (the semiconductor device). Therefore, degradation of the contact with the p-type base region may be prevented in the FWD portion and degradation of the forward voltage (Vf) property may be prevented.

Figure 7:
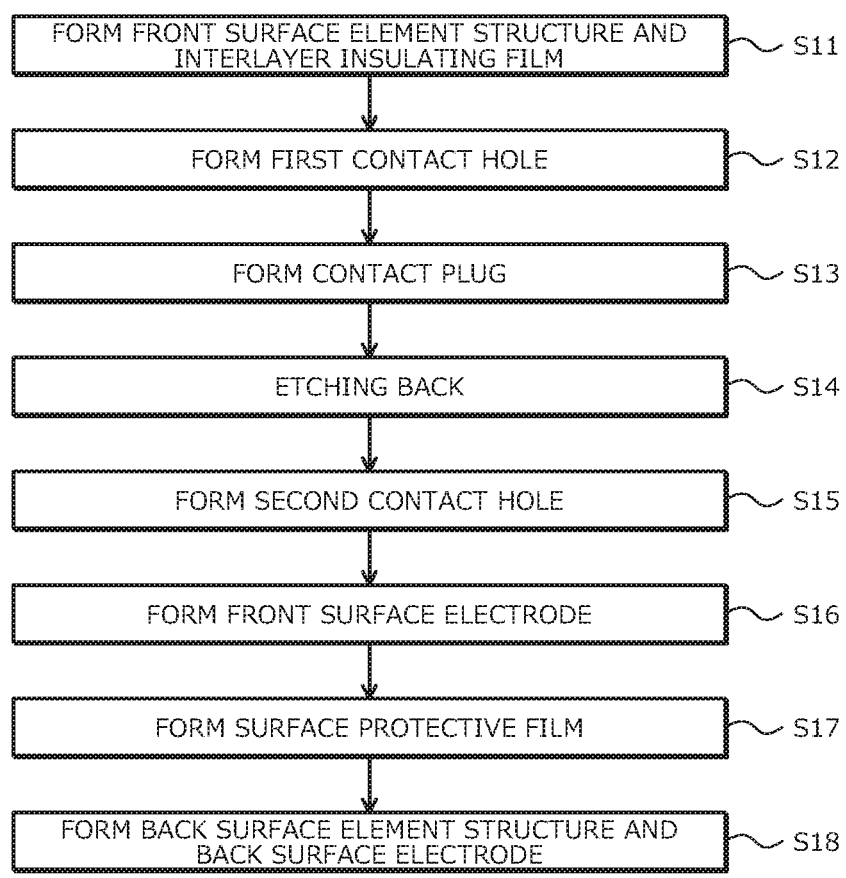
FIG. 7 is a flowchart of an overview of the method of manufacturing a semiconductor device according to a second embodiment.

The method of manufacturing a semiconductor device according to a second embodiment will be described with reference to FIGS. 7 to 11. FIG. 7 is a flowchart of an overview of the method of manufacturing a semiconductor device according to the second embodiment. FIGS. 8, 9, 10, and 11 are cross-sectional views of states in the course of the manufacture of the semiconductor device according to the second embodiment. The method of manufacturing a semiconductor device according to the second embodiment differs from the method of manufacturing a semiconductor device according to the first embodiment in that the first and the second contact holes 9a and 9b are formed using different masks. The method of manufacturing a semiconductor device according to the second embodiment is another example for the manufacture (production) of the RC-IGBT depicted in FIG. 1.

Figure 8:
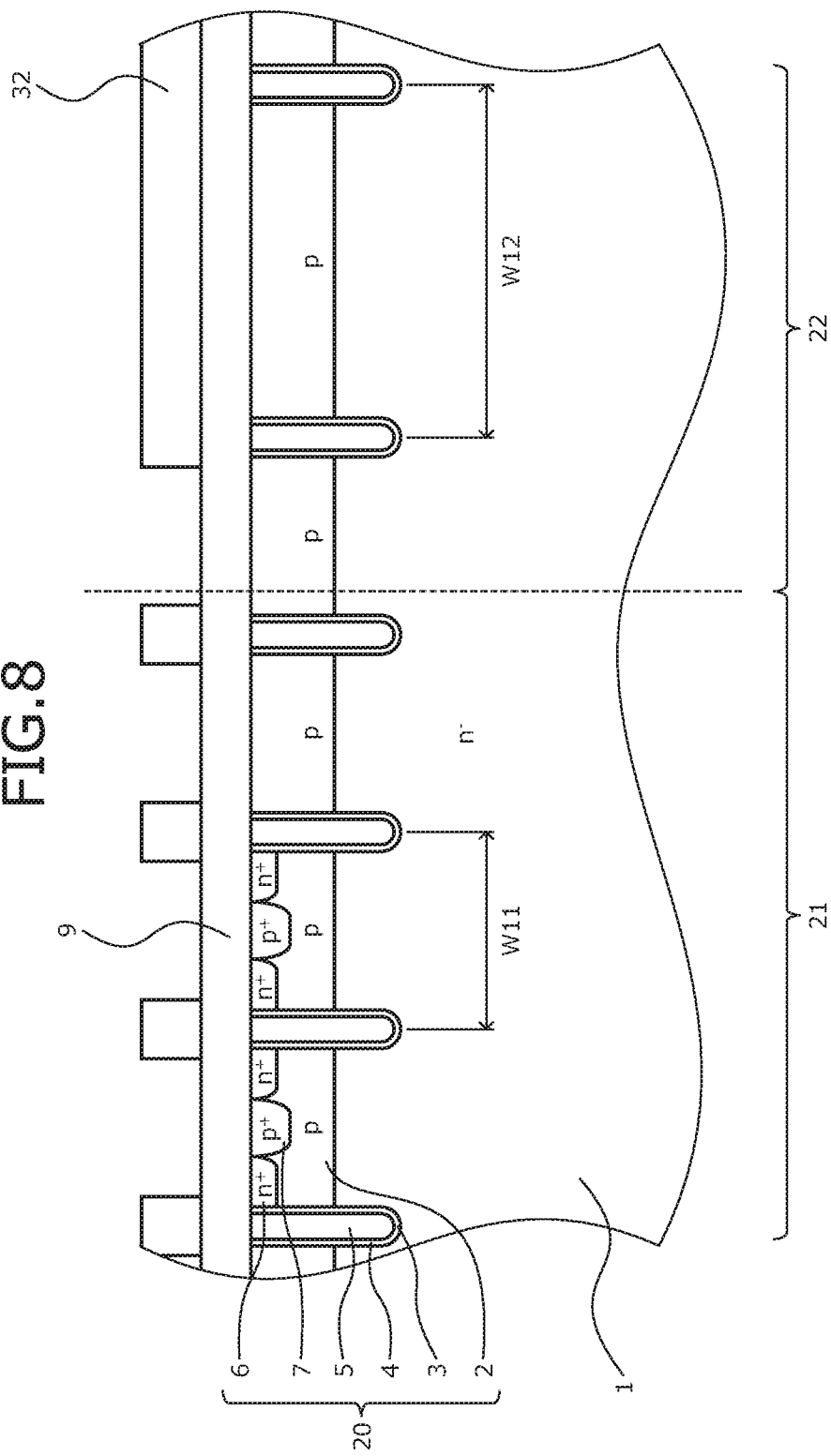
FIGS. 8, 9, 10, and 11 are cross-sectional views of states in the course of the manufacture of the semiconductor device according to the second embodiment.

For example, similar to the first embodiment, the front surface element structure and the interlayer insulating film 9 are formed on the front surface side of the n⁻-type semiconductor substrate (the semiconductor wafer) forming the n⁻-type drift layer 1 (step S11). A resist mask 32 including an opening in the formation region for the first contact hole 9a is formed on the interlayer insulating film 9 using photolithography. FIG. 8 depicts the state of the manufacture completed so far.

Figure 9:
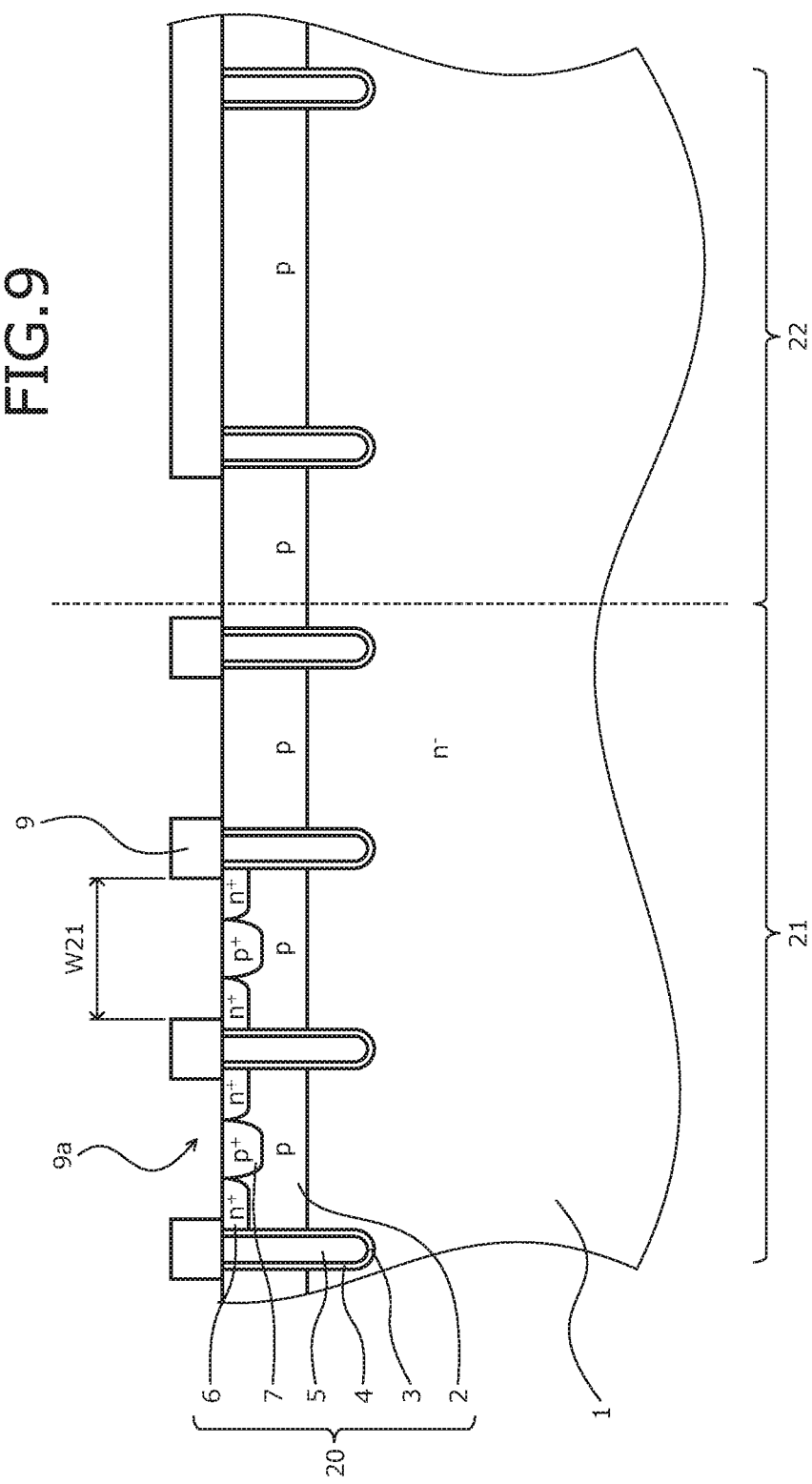

The interlayer insulating film 9 is etched using the resist mask 32 as a mask, to form the first contact hole 9a (step S12). The n⁺-type emitter region 6 and the p⁺-type contact region 7 are thereby exposed in the first contact hole 9a. The resist mask 32 is removed. FIG. 9 depicts the state of the manufacture completed so far.

Figure 10:
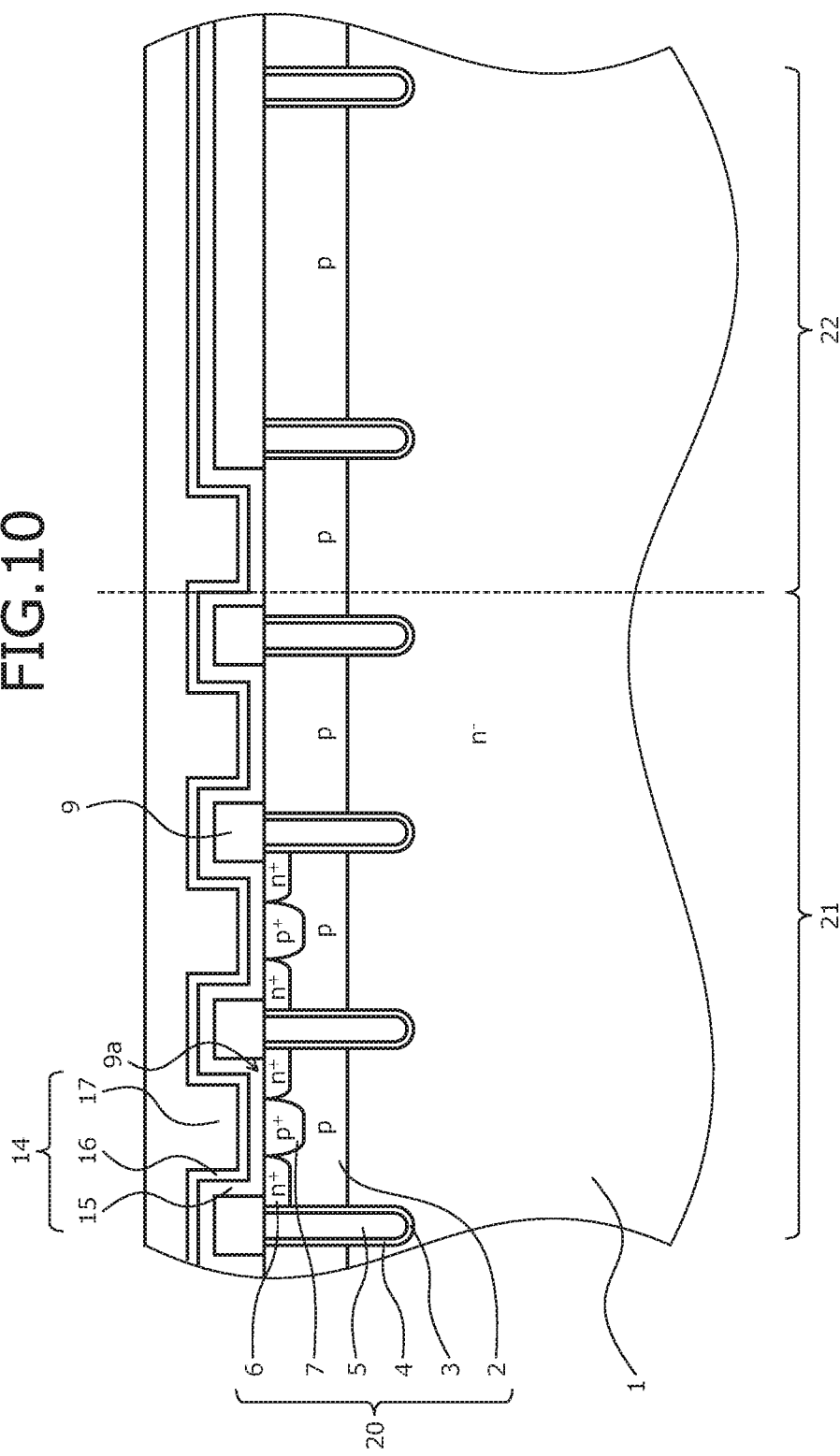

The titanium layer 15, the titanium nitride layer 16, and the tungsten layer 17 are sequentially deposited and the contact plug 14 including the titanium layer 15, the titanium nitride layer 16, and the tungsten layer 17 is formed in the first contact hole 9a (step S13). The formation methods of the titanium layer 15, the titanium nitride layer 16, and the tungsten layer 17 are same as those in the first embodiment. FIG. 10 depicts the state of the manufacture completed so far.

Similar to the first embodiment, the entire semiconductor wafer is heat treated by annealing to form the ohmic contact between the titanium layer 15 and the p$^+$-type contact layer 7. Similar to the first embodiment, the contact plug 14 is etched back until the interlayer insulating film 9 is exposed (step S14). The contact plug 14 thereby remains in the first contact hole 9a.

Figure 11:
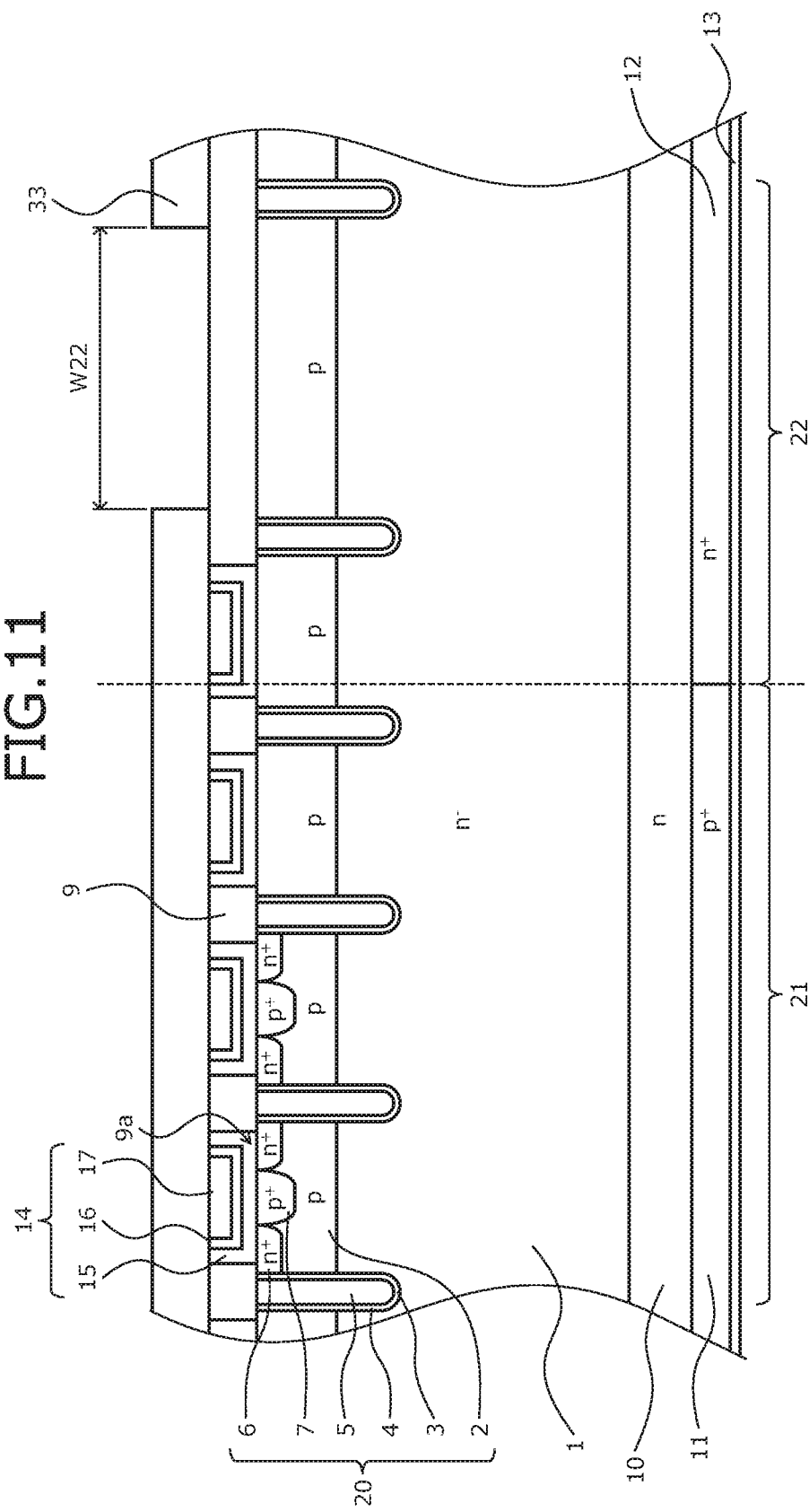

A resist mask 33 including an opening in the formation region for the second contact hole 9b is formed on the interlayer insulating film 9 and the contact plug 14 using photolithography. FIG. 11 depicts the state of the manufacture completed so far.

The interlayer insulating film 9 is etched using the resist mask 33 as a mask, to form the second contact hole 9b (step S15). As depicted in FIG. 6, the p-type base region 2 of the FWD portion 22 is thereby exposed in the second contact hole 9b in a state where the contact plug 14 is embedded in the first contact hole 9a. After the resist mask 33 is removed, similar to the first embodiment, the process steps including and after the formation of the front surface electrode (steps S16 to S18 and the dicing) are sequentially executed. The RC-IGBT depicted in FIG. 1 is thereby completed.

As described above, according to the second embodiment, the contact plug is not formed in the second contact hole in the FWD portion because the second contact hole is not yet formed in the FWD portion when the contact plug is formed in the first contact hole of the IGBT portion. Similar to the first embodiment, the titanium layer is not in contact with the anode region of the FWD portion after the completion of the product, and the same effect as that of the first embodiment may be achieved.

Figure 12:
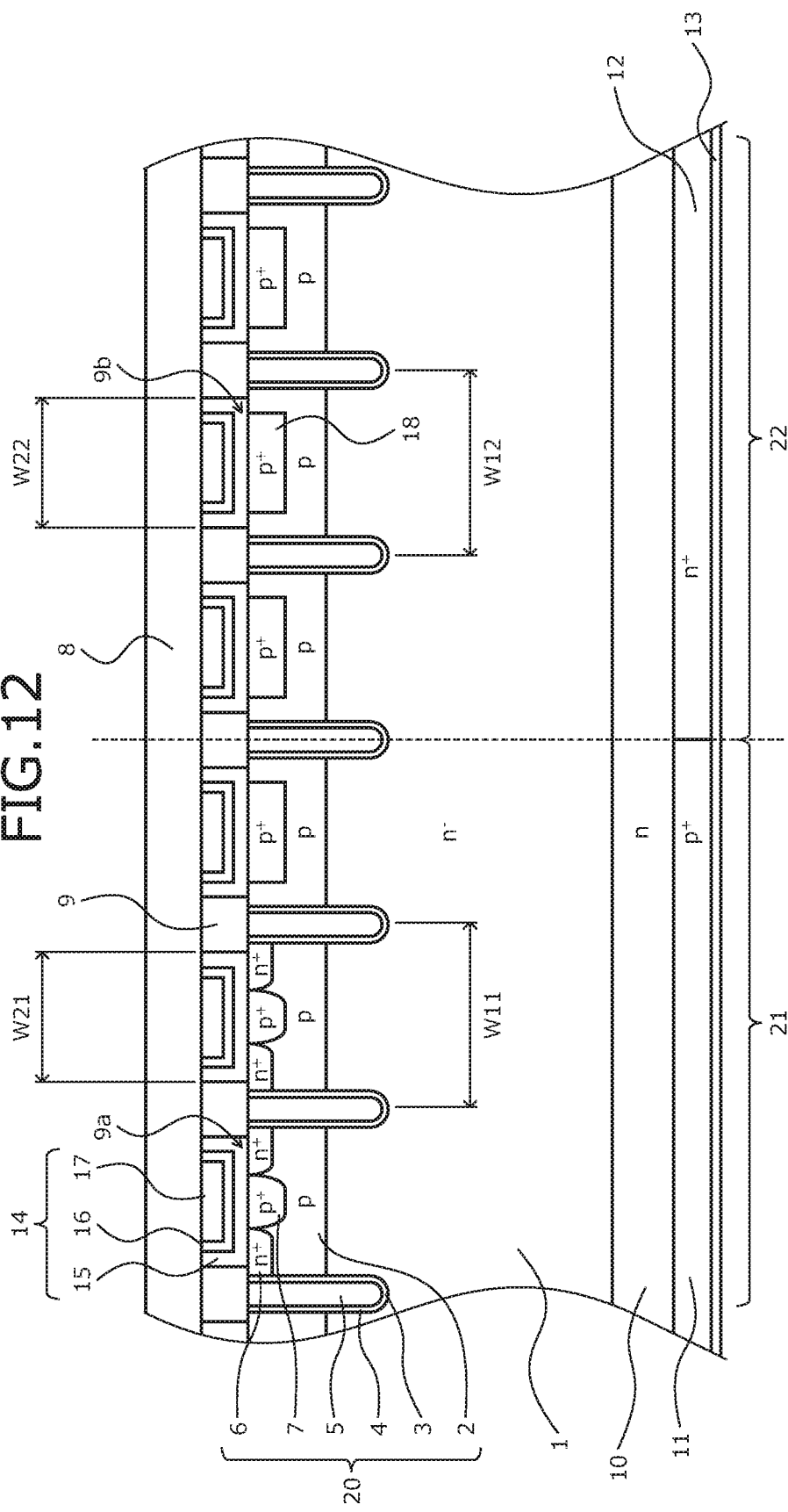
FIG. 12 is a cross-sectional view of the structure of the semiconductor device according to a third embodiment.

The method of manufacturing a semiconductor device according to a third embodiment will be described. FIG. 12 is a cross-sectional view of the structure of the semiconductor device according to the third embodiment. The semiconductor device according to the third embodiment differs from the semiconductor device according to the first embodiment in that the side reduction design rule is for both of the IGBT portion 21 and the FWD portion 22. For example, the IGBT portion 21 and the WDF unit 22 may be reduced in size based on the same design rule. The trenches 3 are formed at equal pitches from the IGBT portion 21 to the FWD portion 22 (W11=W12) and the widths (the widths in the first direction) W21 and W22 of the first and the second contact holes 9a and 9b may be set to be equal to each other (W21=W22). The dimensions of the IGBT portion 21 and the FWD portion 22 may be, for example, same as those of the IGBT portion 21 of the first embodiment.

In the FWD portion 22, similar to the contact plug 14 of the first contact hole 9a (the first contact plug), the contact plug (the second contact plug) 14 is embedded in the second contact hole 9b. The second contact plug 14 is formed by sequentially stacking a titanium layer 15, a titanium nitride layer 16, and a tungsten layer 17.

A second p$^+$-type contact region 18 is formed in the p-type base region 2 that functions as the p-type anode region. The second p$^+$-type contact region 18 contacts the titanium layer 15 to realize favorable ohmic contact with the titanium layer 15. The second p$^+$-type contact region 18 may be formed in, for example, each of the mesa portions that do not have any p$^+$-type contact region (hereinafter, referred to as "first p$^+$-type contact region") 7 formed therein.

The emitter electrode 8 is electrically connected to the second p$^+$-type contact region 18 through the second contact plug 14. The first contact plug 14 functions as the emitter electrode and the second contact plug 14 functions as the anode electrode.

Figure 13:
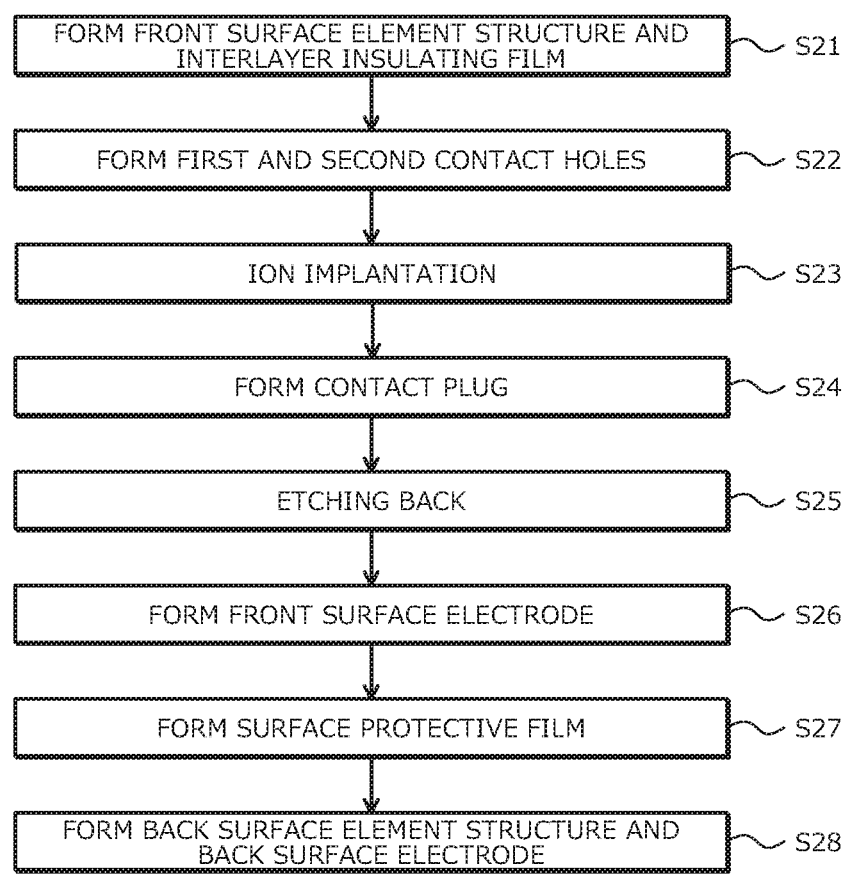
FIG. 13 is a flowchart of an overview of the method of manufacturing a semiconductor device according to the third embodiment.
Figure 14:
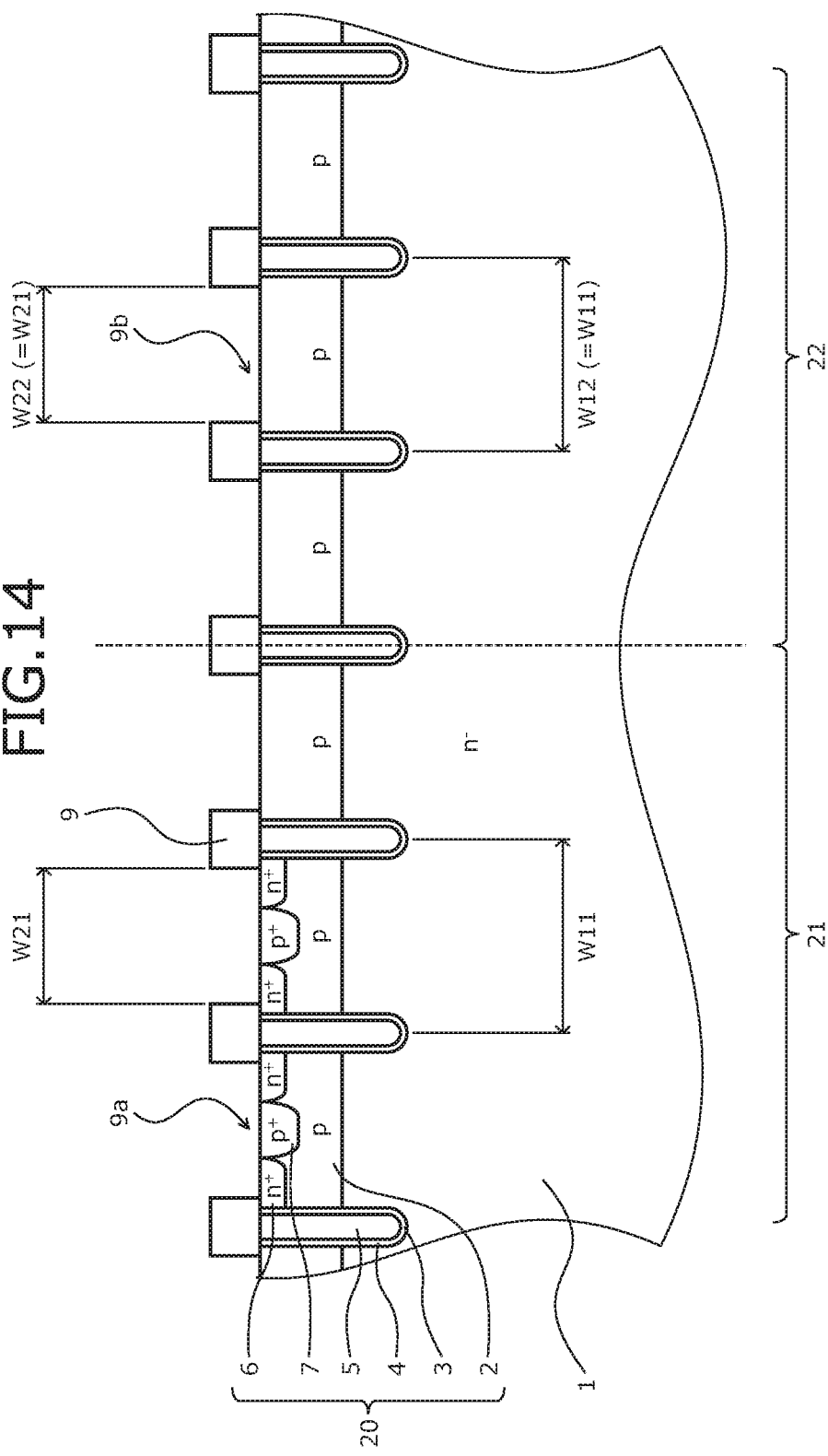
FIGS. 14 and 15 are cross-sectional views of states in the course of the manufacture of the semiconductor device according to the third embodiment.
Figure 15:
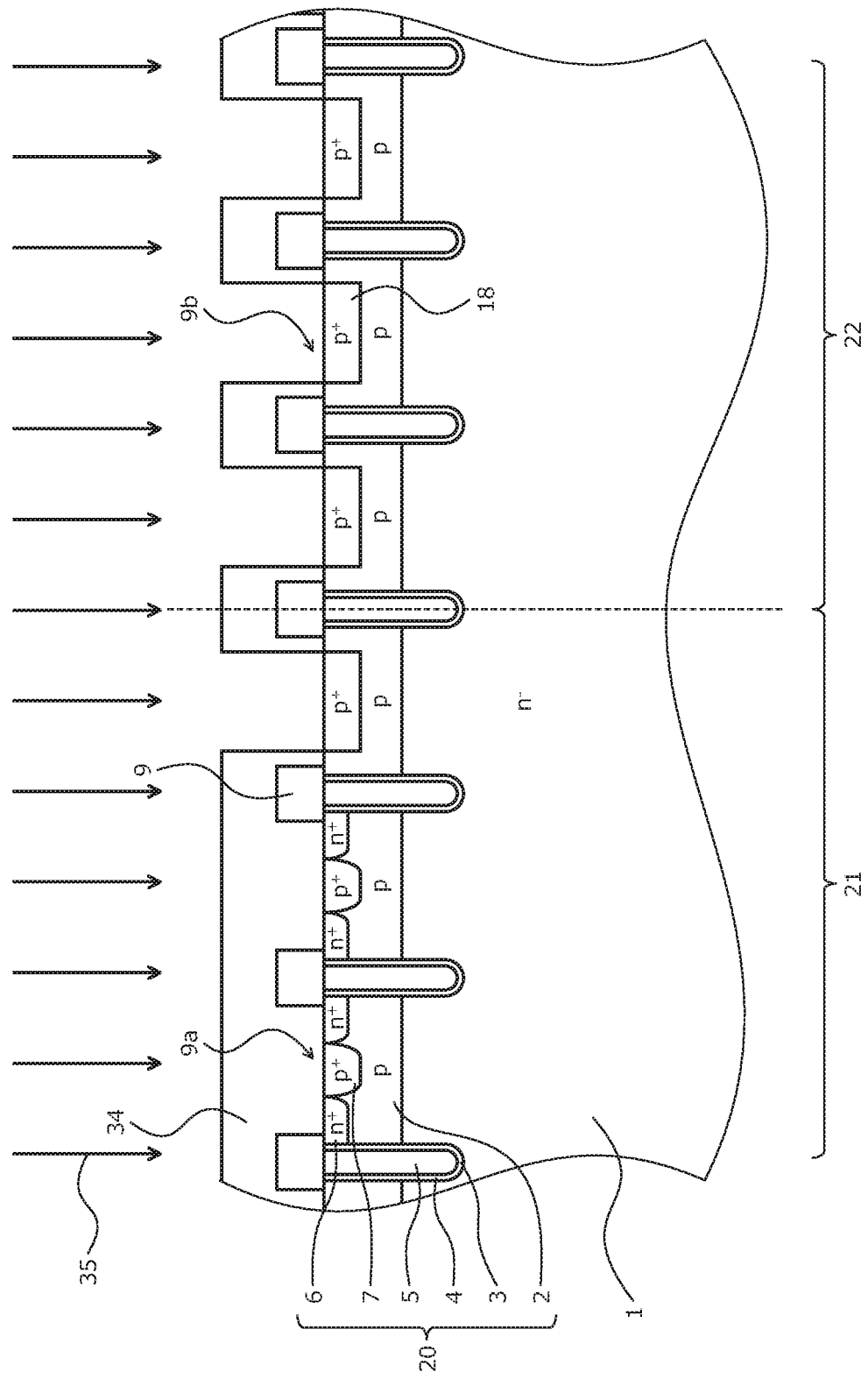

The method of manufacturing a semiconductor device according to the third embodiment will be described. FIG. 13 is a flowchart of an overview of the method of manufacturing a semiconductor device according to the third embodiment. FIGS. 14 and 15 are cross-sectional views of states in the course of the manufacture of the semiconductor device according to the third embodiment.

Similar to the first embodiment, the formation of the front surface element structure and the interlayer insulating film 9 (step S21) and the formation of the first and the second contact holes 9a and 9b (step S22) are sequentially executed. In this case, for example, the pitch W11 of the trenches 3 of the IGBT portion 21 and the pitch W12 of the trenches 3 of the FWD portion 22 are set to be equal to each other (W11=W12) and the widths W21 and W22 of the first and the second contact holes 9a and 9b are set to be equal to each other (W21=W22). FIG. 14 depicts the state of the manufacture completed so far.

A resist mask 34 including openings in the formation regions for the second p$^+$-type contact region 18 is formed using photolithography. The resist mask 34 selectively exposes the p-type base region 2 of the FWD portion 22 in a state where the resist mask 34 covers the n$^+$-type emitter region 6 and the first p$^+$-type contact region 7. The second p$^+$-type contact region 18 is selectively formed in the surface layer of the p-type base region 2 exposed in the openings of the resist mask 34, by ion implantation 35 of a p-type impurity (step S23).

The ion implantation 35 to form the second p$^+$-type contact region 18 may employ, for example, boron fluoride (BF$_2$) as the ion species thereof and 30 keV as the acceleration energy thereof. The depth of the second p$^+$-type contact region 18 may be, for example, equal to or less than about 0.5 µm. FIG. 15 depicts the state of the manufacture completed so far.

After the resist mask 34 is removed, the second p$^+$-type contact region 18 is activated by, for example, heat treatment at a temperature of about 650° C. and for about 30 minutes. The formation of the contact plug 14 (step S24) and the etching back (step S25) are sequentially executed similar to the first embodiment. In this case, at step S24, the contact plug 14 is fully embedded in each of the first and the second contact holes 9a and 9b and, at step S25, the contact plugs 14 are left in the state where the contact plugs 14 substantially fully fill the first and the second contact holes 9a and 9b.

Thereafter, similar to the first embodiment, the process steps from the formation of the front surface electrode to the formation of the back surface element structure and the back surface electrode are sequentially executed (steps S26 to S28). The RC-IGBT depicted in FIG. 12 is thereby completed.

As described above, according to the third embodiment, the ohmic contact may be acquired in the FWD portion even when the contact plug is embedded in the second contact hole of the FWD portion similar to the first contact hole of the IGBT portion, by forming the second p$^+$-type contact region in the p-type base region that functions as the p-type anode region. Thus, the same effect as that of each of the first and the second embodiments may be achieved even when the FWD portion is reduced in size similar to the IGBT portion, and further size reductions may be facilitated by reducing the size of the IGBT portion and the FWD portion.

Figure 16:
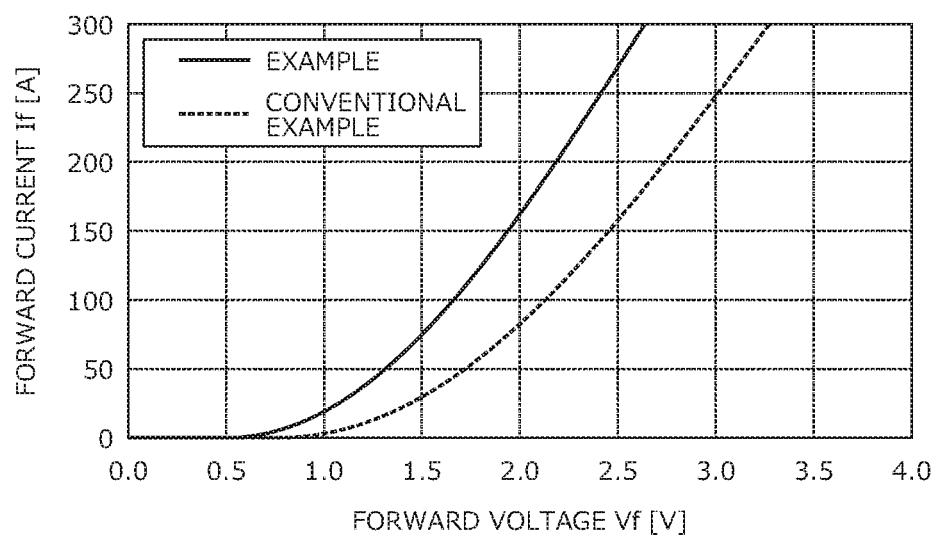
FIG. 16 is a characteristics diagram of forward voltage characteristics of a semiconductor device according to Example.
Figure 17:
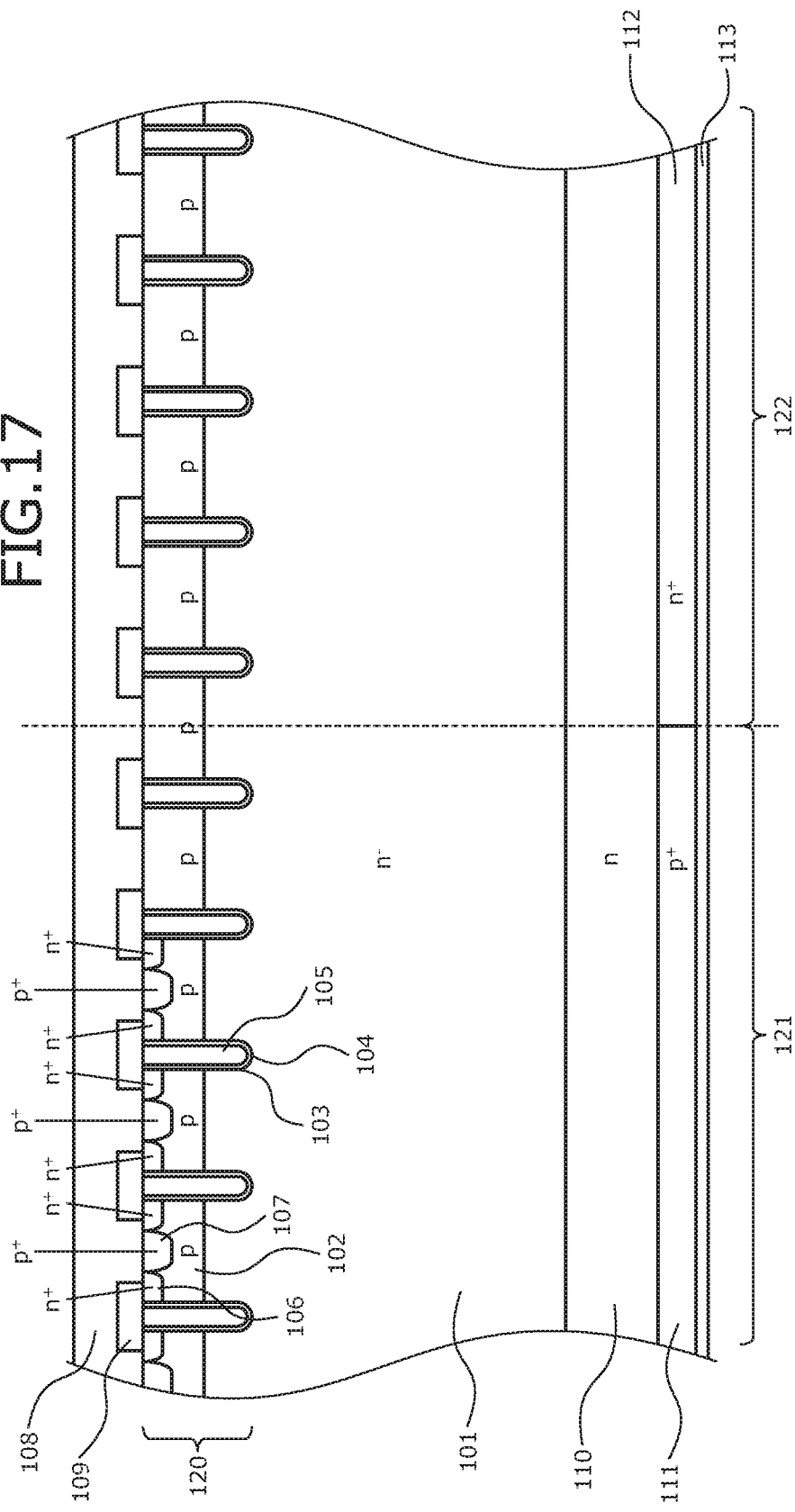
FIG. 17 is a cross-sectional view of a configuration of a conventional RC-IGBT having a field stop structure.

Verification was executed for the forward voltage (Wf) property of the RC-IGBT according to the present invention. FIG. 16 is a characteristics diagram of the forward voltage characteristics of the semiconductor device according to Example. According to the method of manufacturing a semiconductor device according to the first embodiment, an RC-IGBT configured based on a size reduction design rule was manufactured (produced) (hereinafter, referred to as "Example"). Example had a configuration in which the emitter electrode and the semiconductor portion were electrically connected to each other through the contact plug in the IGBT portion and the emitter electrode and the semiconductor portion were directly connected to each other in the FWD portion.

FIG. 16 depicts forward voltage characteristics of Example. FIG. 16 also depicts forward voltage characteristics of an RC-IGBT in which the emitter electrode and the semiconductor portion were electrically connected to each other through a contact plug in each of the IGBT portion thereof and the FWD portion thereof, as a comparative device (hereinafter, referred to as "Conventional Example"). The configurations other than the contact of the FWD portion of Conventional Example were same as those of Example.

From the result depicted in FIG. 16, it was confirmed for Example that the forward voltage Vf could be reduced to a greater extent than that of Conventional Example. It was confirmed that degradation of the contact with the p-type base region having a low impurity concentration and functioning as an anode region could be prevented by not forming any titanium layer for the contact with the semiconductor portion also in the FWD portion integrated with the IGBT on a single semiconductor chip.

In the above, the present invention is not limited to the embodiments and may be changed variously within the scope not departing from the gist of the present invention. For example, in the third embodiment, the second $p^+$-type contact region of the FWD portion may be formed simultaneously with the first $p^+$-type contact region of the IGBT portion.

In the first and the second embodiments, the second $p^+$-type contact region may be formed in the p-type base region (the anode region) of the FWD portion as in the third embodiment. In this case, for example, the second $p^+$-type contact region may be formed by ion implantation before the contact plug is embedded in the first contact hole, or the second $p^+$-type contact region of the FWD portion may be formed simultaneously with the first $p^+$-type contact region of the IGBT portion.

In each of the embodiments, the description has been made taking the example where the gate electrode is formed through the gate insulating film in the trench however the conductor embedded in the trench through the insulating film is not limited to the gate electrode. For example, conductors embedded in some trenches of the plural trenches may be electrically connected to the emitter electrode or the anode electrode at a potential equal to that of the emitter electrode to equalize the potentials of the conductors and the emitter electrode to each other. The trenches each having a conductor different from the gate electrode embedded therein may each be called "dummy trench". In the embodiments, the dimensions of the components are variously set according to required specifications or the like.

However, in the conventional RC-IGBT, the ohmic contact is realized with the p-type base region 102 whose impurity concentration is low and that functions as an anode region in the FWD portion, by embedding the emitter electrode 108 including aluminum-silicon in the contact hole as described above. In the IGBT, however, with size reduction design rules (design standards), tungsten tends to be used as the electrode material to be embedded in the contact hole. The contact (electrical contact) is not favorable between tungsten and silicon, and a titanium layer or the like is formed between the tungsten layer and the semiconductor portion in an ordinary IGBT.

Further, in the conventional RC-IGBT, because the IGBT portion and the FWD portion are integrally formed on the same semiconductor chip, when the IGBT portion is reduced in size to form the contact between the titanium layer and the semiconductor portion, the contact is also formed between the titanium layer and the semiconductor portion in the FWD portion that is not reduced in size. In the FWD portion, when the contact with the semiconductor portion (the p-type base region) is formed using the titanium layer, the contact with the p-type base region is degraded and a problem arises in that forward voltage (Vf) characteristics are degraded.

According to the present invention, the ohmic contact may be realized in both of the first and the second element regions even when the first element region is reduced in size, by optimizing the electrode material forming the contact in each of the first and the second regions for the diffusion region (the semiconductor portion).

According to the present invention, when the metal layer is embedded in the contact hole of the first element region (the first contact hole), the metal layer does not sufficiently fill the contact hole of the second element region (the second contact hole). Consequently, the semiconductor portion (the base region that functions as the anode region) may be exposed in the second contact hole in a state where the metal layer is embedded in the first contact hole, by etching back the metal layer. By depositing the emitter electrode in this state, the emitter electrode and the semiconductor portion are electrically connected to each other through the metal layer (the contact plug) in the first element region and the emitter electrode and the semiconductor portion are directly connected to each other in the second element region.

Further, the contact of each of the first and the second element regions may be formed using an electrode material different from each other, and the ohmic contact may be realized in each of the first and the second regions. In reducing the size of the first element region, the contact may be formed not using any metal that degrades the contact with the base region in the second element region, and degradation of the forward voltage characteristics may be prevented.

According to the semiconductor device and the method of manufacturing a semiconductor device of the present invention, an effect is achieved in that favorable diode characteristics may be realized in an RC-IGBT for which the design rule facilitates size reduction.

As described above, the semiconductor device and the method of manufacturing a semiconductor device according to the present invention are useful for an RC-IGBT that realizes a low loss and a high breakdown voltage by reducing the thickness of the chip (the thickness of the drift layer) and are especially suitable for an RC-IGBT based on a size reduction design rule.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate forming a drift layer of a first conductivity type, and including a first element region for forming an insulated gate bipolar transistor and a second element region for forming a diode;
a plurality of trenches formed on a front surface of the semiconductor substrate in both the first element region and the second element region;
a plurality of gate electrodes, each formed in one of the plurality of trenches with a gate insulating film therebetween;
a base region of a second conductivity type formed between adjacent trenches of the plurality of trenches in the first element region;
an anode region of the second conductivity type formed between adjacent trenches of the plurality of trenches in the second element region;
a plurality of emitter regions of the first conductivity type selectively formed in the base region;
a plurality of first contact regions of the second conductivity type selectively formed in the base region and having an impurity concentration higher than that of the base region;
an interlayer insulating film covering the gate electrodes;
a plurality of first contact holes, each penetrating the interlayer insulating film in a depth direction thereof;
a second contact hole penetrating the interlayer insulating film in the depth direction thereof;
a plurality of contact plugs, each embedded in one of the first contact holes to contact both at least one of the emitter regions and one of the first contact regions;
a first electrode contacting the contact plugs, and contacting the anode region via the second contact hole;
a collector region of the second conductivity type formed on a back surface of the semiconductor substrate in the first element region;
a cathode region of the first conductivity type formed on the back surface of the semiconductor substrate in the second element region; and
a second electrode contacting the collector region and the cathode region, wherein
the first element region is arranged next to the second element region along an arrangement direction, and
a width of the second contact hole along the arrangement direction is greater than a width of each first contact hole along the arrangement direction.

2. The semiconductor device according to claim 1, wherein
each contact plug comprises at least:
a titanium layer contacting at least one emitter region and one of the first contact regions; and
a tungsten layer contacting the first electrode.

3. The semiconductor device according to claim 1, wherein
the first electrode is formed of a metal comprising aluminum as a main component thereof.

4. The semiconductor device according to claim 1, wherein
an interval between any adjacent two of the trenches in the second element region is greater than an interval between any adjacent two of the trenches in the first element region.

5. The semiconductor device according to claim 1, further comprising
a second contact region of the second conductivity type selectively formed in the anode region and having an impurity concentration higher than that of the anode region.

6. A semiconductor device, comprising:
a semiconductor substrate forming a drift layer of a first conductivity type, and including a first element region for forming an insulated gate bipolar transistor, and a second element region for forming a diode, an interface between the first and second element regions forming an intermediate region;
a plurality of trenches formed on a front surface of the semiconductor substrate in both the first element region and the second element region;
a plurality of gate electrodes, each formed in one of the plurality of trenches with a gate insulating film therebetween;
a base region of a second conductivity type formed between adjacent trenches of the plurality of trenches;
a plurality of emitter regions of the first conductivity type selectively formed in the base region in the first element region;
a plurality of contact regions of the second conductivity type selectively formed in the base region and having an impurity concentration higher than that of the base region;
an interlayer insulating film covering the gate electrodes;
a plurality of first contact holes, each penetrating the interlayer insulating film in a depth direction thereof in the first element region;
a plurality of second contact holes, each penetrating the interlayer insulating film in the depth direction thereof in the second element region and the intermediate region;
a plurality of first contact plugs, each embedded in one of the first contact holes to contact both at least one of the emitter regions and one of the contact regions;
a plurality of second contact plugs, each embedded in one of the second contact holes to contact the base region and one of the contact regions;
a first electrode contacting the first contact plugs and the second contact plugs;
a collector region of the second conductivity type formed on a back surface of the semiconductor substrate in the first element region;
a cathode region of the first conductivity type formed on the back surface of the semiconductor substrate in the second element region; and
a second electrode contacting the collector region and the cathode region, wherein
the base region in the intermediate region has only ones of the contact regions formed therein,
the first element region is arranged next to the second element region along an arrangement direction, and
a width of each second contact hole along the arrangement direction is greater than a width of each first contact hole along the arrangement direction.

7. A method of manufacturing a semiconductor device, comprising:
providing a semiconductor substrate;
forming an insulated gate bipolar transistor and a diode on a front surface of the semiconductor substrate respectively in first and second element regions thereof, so as to have a plurality of trenches formed on a front surface of the semiconductor substrate in both the first and second element regions, a plurality of gate electrodes, each formed in one of the plurality of trenches with a gate insulating film therebetween, a base region of a second conductivity type formed between adjacent ones of the trenches in the first element region, an anode region of the second conductivity type formed between adjacent ones of the trenches in the second element region, a plurality of emitter regions of the first conductivity type selectively formed in the base region in the first element region, and a plurality of contact regions of the second conductivity type selectively formed in the base region and having an impurity concentration higher than that of the base region;

forming an interlayer insulating film to cover the insulated gate bipolar transistor and the diode;

forming a plurality of first contact holes to penetrate the interlayer insulating film in a depth direction thereof, so as to expose the emitter regions and the contact regions;

forming a second contact hole to penetrate the interlayer insulating film in the depth direction thereof, so as to expose the anode region, a width of the second contact hole in an arrangement direction, along which the first element region is arranged next to the second element region, being greater than that of each first contact hole;

depositing a metal layer on a surface of the interlayer insulating film and in the first and second contact holes;

etching the metal layer to remove the metal layer on the surface of the interlayer insulating film and in the second contact hole, so that the metal layer in the first contact holes remains as a plurality of contact plugs of the emitter regions and the contact regions; and forming a first electrode to contact the contact plugs and in the second contact hole.

8. The method of manufacturing a semiconductor device according to claim 7, wherein
depositing the metal layer includes sequentially depositing at least a titanium layer and a tungsten layer.

9. The method of manufacturing a semiconductor device according to claim 7, wherein
the first electrode has aluminum as a main component thereof.

10. A method of manufacturing a semiconductor device, comprising:
providing a semiconductor substrate;
forming an insulated gate bipolar transistor and a diode on a front surface of the semiconductor substrate respectively in first and second element regions thereof, so as to have
a plurality of trenches formed on a front surface of the semiconductor substrate in both the first and second element regions, a plurality of gate electrodes, each formed in one of the plurality of trenches with a gate insulating film therebetween, a base region of a second conductivity type formed between adjacent ones of the trenches in the first element region, an anode region of the second conductivity type formed between adjacent ones of the trenches in the second element region, a plurality of emitter regions of the first conductivity type selectively formed in the base region in the first element region, and a plurality of first contact regions of the second conductivity type selectively formed in the base region and having an impurity concentration higher than that of the base region;

selectively forming a plurality of second contact regions, which are of the second conductivity type and have an impurity concentration higher than that of the base region, in the base region;

forming an interlayer insulating film to cover the insulated gate bipolar transistor and the diode;

forming a plurality of first contact holes to penetrate the interlayer insulating film in a depth direction thereof in the first element region, so as to expose the emitter regions and the first contact regions;

forming a plurality of second contact holes to penetrate the interlayer insulating film in the depth direction thereof in the second element region and in an intermediate region that is an interface between the first and second element regions, so as to expose the base region and the second contact regions;

depositing a metal layer on a surface of the interlayer insulating film and in the first and second contact holes;

etching the metal layer to remove the metal layer on the surface of the interlayer insulating film, so that the metal layer in the first contact holes remains as first contact plugs of the emitter regions and the first contact regions, and that the metal layer in the second contact holes remains as second contact plugs of the base region and the second contact regions; and forming a first electrode to contact the first contact plugs and the second contact plugs, wherein
the first element region is arranged next to the second element region along an arrangement direction, and
a width of each second contact hole along the arrangement direction is greater than a width of each first contact hole along the arrangement direction.

11. The method of manufacturing a semiconductor device according to claim 10, wherein
the second contact region is formed by ion-implanting boron fluoride.

12. The method of manufacturing a semiconductor device according to claim 10, wherein
the first electrode has aluminum as a main component thereof.

* * * * *